(12) United States Patent
Katayama

(10) Patent No.: US 11,101,358 B2
(45) Date of Patent: Aug. 24, 2021

(54) SEMICONDUCTOR DEVICE AND MANUFACTURING METHOD THEREOF

(71) Applicant: UNITED SEMICONDUCTOR JAPAN CO., LTD., Kuwana (JP)

(72) Inventor: Masaya Katayama, Toin (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 0 days.

(21) Appl. No.: 16/657,213

(22) Filed: Oct. 18, 2019

(65) Prior Publication Data

US 2020/0127107 A1 Apr. 23, 2020

(30) Foreign Application Priority Data

Oct. 23, 2018 (JP) .............................. JP2018-199364

(51) Int. Cl.
*H01L 29/423* (2006.01)
*H01L 29/40* (2006.01)
*H01L 29/66* (2006.01)
*H01L 29/06* (2006.01)

(52) U.S. Cl.
CPC .... *H01L 29/42376* (2013.01); *H01L 29/0607* (2013.01); *H01L 29/401* (2013.01); *H01L 29/66545* (2013.01)

(58) Field of Classification Search
CPC .......... H01L 29/42376; H01L 29/0607; H01L 29/401; H01L 29/66545

See application file for complete search history.

(56) References Cited

U.S. PATENT DOCUMENTS

| | | | |
|---|---|---|---|
| 9,613,953 B2 * | 4/2017 | Liaw | H01L 21/823437 |
| 2003/0230771 A1 | 12/2003 | Lee | |
| 2004/0213029 A1 | 10/2004 | Hirata et al. | |
| 2005/0196889 A1 | 9/2005 | Lee | |
| 2006/0128050 A1 | 6/2006 | Lee | |
| 2008/0135912 A1 | 6/2008 | Lee et al. | |
| 2010/0327371 A1 | 12/2010 | Lee et al. | |

(Continued)

FOREIGN PATENT DOCUMENTS

| | | |
|---|---|---|
| JP | 2004-23097 A | 1/2004 |
| JP | 2004-327574 A | 11/2004 |
| JP | 2008-147664 A | 6/2008 |

*Primary Examiner* — Christine A Enad
(74) *Attorney, Agent, or Firm* — Winston Hsu

(57) ABSTRACT

A semiconductor device includes a semiconductor substrate, a first semiconductor area of a first conductive type disposed in a surface layer portion of the semiconductor substrate, a gate electrode disposed over the first semiconductor area and extending in a first direction, a dummy gate electrode disposed over the semiconductor substrate away from the gate electrode and extending in the first direction, a second semiconductor area of a second conductive type disposed, in the surface layer portion of the semiconductor substrate, between the gate electrode and the dummy gate electrode, and an interconnect connected to the second semiconductor area, wherein a concentration of carrier of a first carrier type in the semiconductor substrate under the dummy gate electrode and alongside the second semiconductor area is lower than a concentration of majority carrier in the first semiconductor area, the first carrier type being a same carrier type as the majority carrier.

20 Claims, 33 Drawing Sheets

(56) References Cited

U.S. PATENT DOCUMENTS

2018/0261596 A1* 9/2018 Jun .................... H01L 27/0886
2018/0269220 A1* 9/2018 Divakaruni ....... H01L 29/66833
2018/0350802 A1* 12/2018 Lee ................. H01L 21/823475
2019/0189765 A1* 6/2019 Lee ...................... H01L 23/564

* cited by examiner

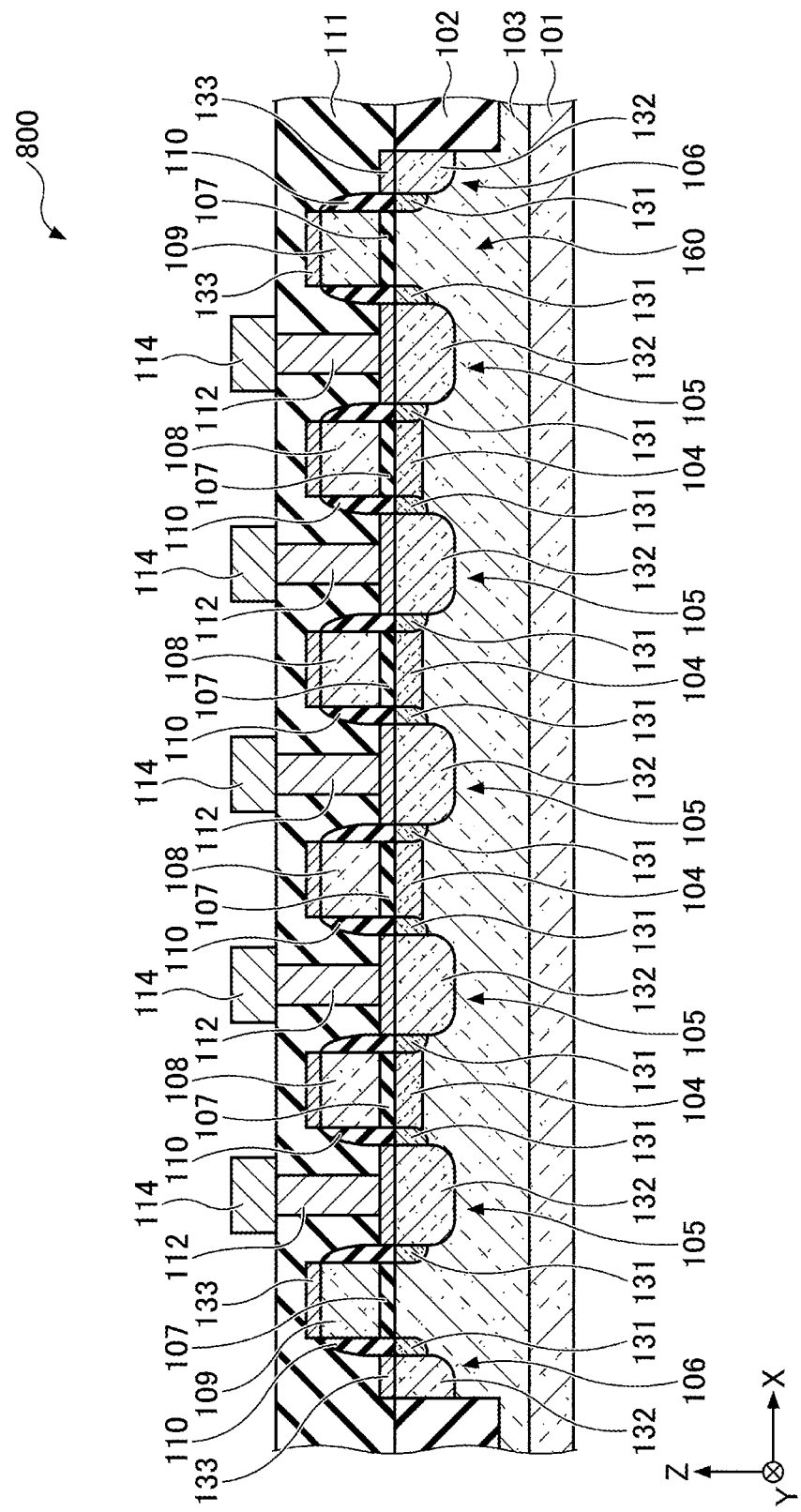

SEMICONDUCTOR DEVICE AND MANUFACTURING METHOD THEREOF

CROSS-REFERENCE TO RELATED APPLICATIONS

The present application is based upon and claims the benefit of priority from the prior Japanese Patent Application No. 2018-199364 filed on Oct. 23, 2018, with the Japanese Patent Office, the entire contents of which are incorporated herein by reference.

FIELD

The disclosures herein relate to a semiconductor device and a manufacturing method thereof.

BACKGROUND

Conventionally, a gate length of a gate electrode included in a transistor of a semiconductor device may deviate from a design value. For example, in a semiconductor device including a plurality of gate electrodes arranged at regular intervals and extending in one direction, the gate length may be different between the outermost gate electrode and the inner gate electrodes. The gate length sometimes may deviate from the design value in a gate electrode in an isolated pattern where there is no other gate electrode. One of causes of this deviation is a difference in a pattern density of an exposure mask used for exposure when the gate electrode is formed. Therefore, dummy gate electrodes may be provided at the side of the gate electrode of the actually operated transistor to improve the uniformity of the pattern density of the exposure mask.

However, in the semiconductor device in which the dummy gate electrodes are provided as described above, a leakage current tends to increase.

RELATED-ART DOCUMENTS

Patent Document

[PTL 1] Japanese Laid-Open Patent Publication No. 2004-23097
[PTL 2] Japanese Laid-Open Patent Publication No. 2008-147664
[PTL 3] Japanese Laid-Open Patent Publication No. 2004-327574

SUMMARY

According to an aspect of the embodiment, a semiconductor device includes a semiconductor substrate, a first semiconductor area of a first conductive type disposed in a surface layer portion of the semiconductor substrate, a gate electrode disposed over the first semiconductor area and extending in a first direction, a dummy gate electrode disposed over the semiconductor substrate away from the gate electrode and extending in the first direction, a second semiconductor area of a second conductive type disposed, in the surface layer portion of the semiconductor substrate, between the gate electrode and the dummy gate electrode, and an interconnect connected to the second semiconductor area, wherein a concentration of carrier of a first carrier type in the semiconductor substrate under the dummy gate electrode and alongside the second semiconductor area is lower than a concentration of majority carrier in the first semiconductor area, the first carrier type being a same carrier type as the majority carrier.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 23B is a cross sectional view illustrating the semiconductor device according to the eighth embodiment.

DESCRIPTION OF EMBODIMENT

Figure 1A:
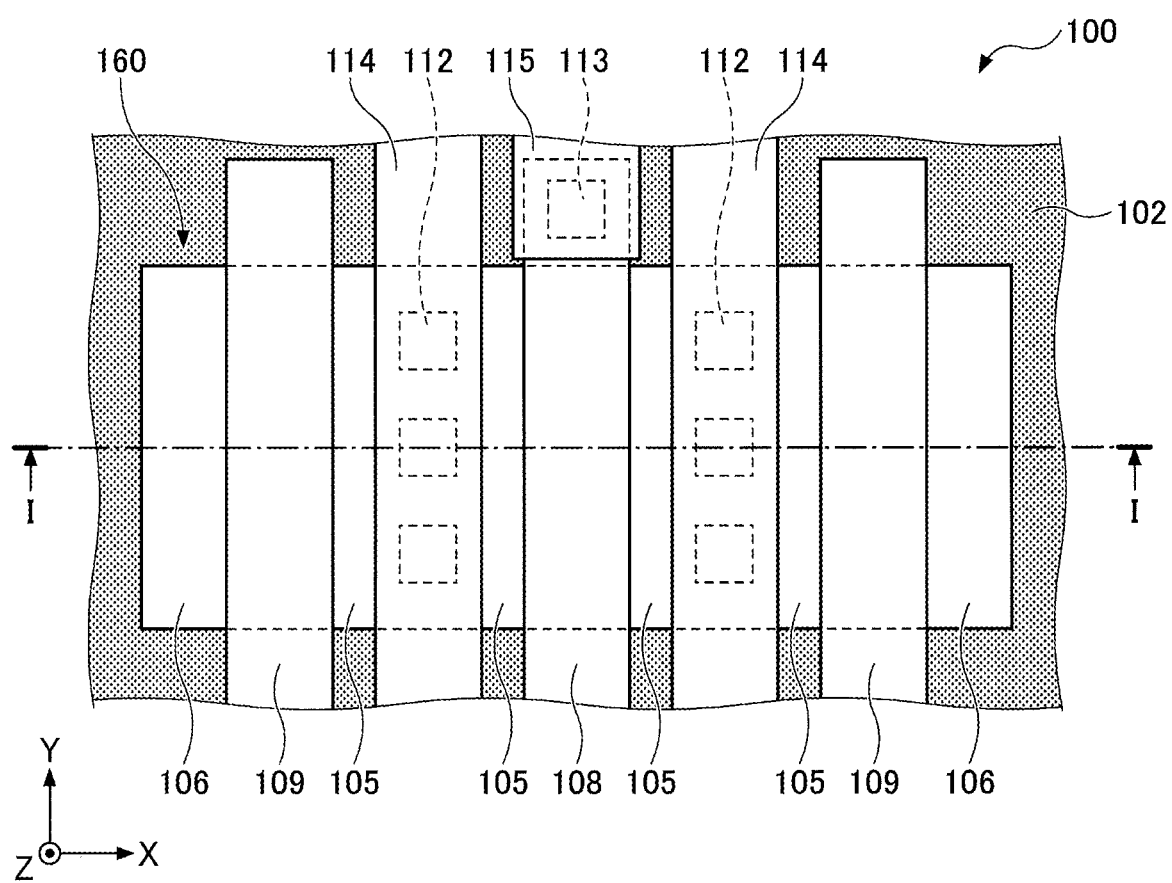
FIG. 1A is a top view illustrating a semiconductor device according to a first embodiment.

Hereinafter, embodiments of the present disclosure will be described in detail with reference to the accompanying drawings. In addition, in this specification and drawings, constituent elements having substantially the same functional configurations may be given the same reference numerals, and redundant descriptions thereabout are omitted.

First Embodiment

Figure 1B:
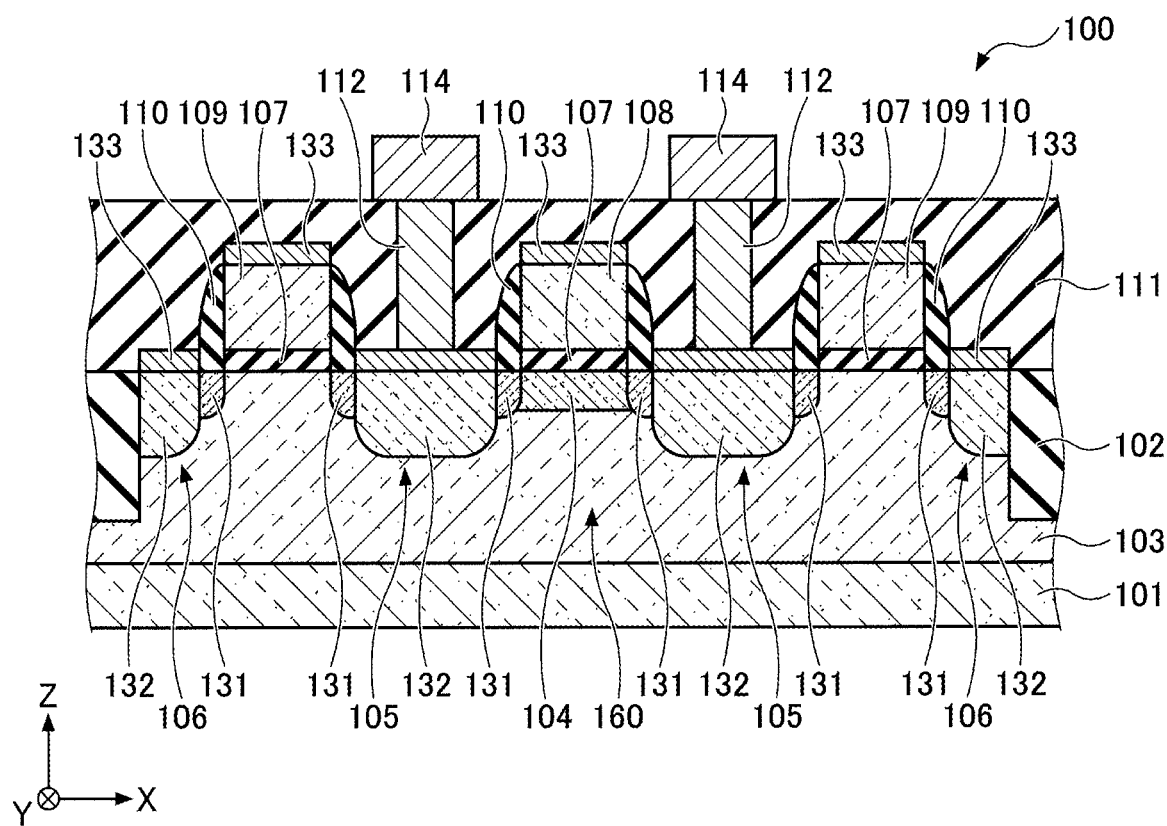
FIG. 1B is a cross sectional view illustrating the semiconductor device according to the first embodiment.

First, the first embodiment will be explained. FIG. 1A is a top view illustrating a semiconductor device according to the first embodiment. FIG. 1B is a cross sectional view illustrating the semiconductor device according to the first embodiment. FIG. 1A mainly illustrates a positional relationship among a device isolation insulation film, source and drain semiconductor areas, electrodes, and interconnects. FIG. 1B corresponds to a cross sectional view taken along line I-I of FIG. 1A.

As illustrated in FIG. 1A and FIG. 1B, a semiconductor device 100 according to the first embodiment is formed with a device isolation insulation film 102 defining a device active area 160 in a surface layer portion of a p-type semiconductor substrate 101. The semiconductor substrate 101 is, for example, a silicon (Si) substrate. The semiconductor substrate 101 has a device active area where a p-channel type transistor is formed and a device active area where an n-channel type transistor is formed, but FIG. 1A and FIG. 1B illustrate the device active area 160 in which an n-channel type transistor is formed. For example, the planar shape of the device active area 160 is in a rectangular shape. In the following description, a direction parallel to the long side of the device active area 160 is defined as an X direction, a direction parallel to the short side is defined as a Y direction, and a thickness direction of the semiconductor substrate 101 is defined as a Z direction. The X direction is an example of a second direction, and the Y direction is an example of a first direction.

A p well 103 is formed to include the device active area 160. For example, the p well 103 contains boron (B) as a p-type impurity. For example, when the semiconductor substrate 101 is a p-type, the p well 103 can be omitted, and the semiconductor substrate 101 can also serve as a p-type area to operate as the p well 103. In that case, "p well 103" in this specification may read as "semiconductor substrate 101" as appropriate. One gate electrode 108 and two dummy gate electrodes 109 are formed over the p well 103. Gate insulating films 107 are formed between the gate electrode 108 and the p well 103 and between the dummy gate electrodes 109 and the p well 103. The gate electrode 108 and the dummy gate electrodes 109 extend parallel to the Y direction. That is, the gate electrode 108 is located between the two dummy gate electrodes 109. For example, the thickness of the gate insulating film 107 is 1.0 nm to 10.0 nm. The thicknesses of the gate electrode 108 and the dummy gate electrodes 109 are 50 nm to 200 nm. Examples of materials of the gate insulating film 107 include insulators such as silicon oxide ($SiO_2$), silicon nitride ($Si_3N_4$), and hafnium oxide (HfO$_2$). Examples of materials of the gate electrode 108 and the dummy gate electrodes 109 include polycrystalline silicon (polysilicon). Metals such as titanium (Ti) and tungsten (W) and nitrides of these metals can also be used as materials for the gate electrode 108 and the dummy gate electrode 109.

Spacers (sidewalls) 110 of insulating films are formed on both sides of the gate electrode 108 and the dummy gate electrodes 109 in the X direction. In the surface layer portion of the p well 103, an n-type semiconductor area 131 is formed under the spacer 110 at a first depth, and n-type semiconductor areas 132 are formed, at a second depth deeper than the first depth, in portions exposed from the spacer 110, the gate electrode 108, and the dummy gate electrodes 109. For example, the n-type semiconductor area 131 contains phosphorus (P) as an n-type impurity at a first impurity concentration. The n-type semiconductor area 132 contains phosphorus as an n-type impurity concentration at a second impurity concentration higher than the first impurity concentration. Among the n-type semiconductor areas 131 and 132, those located between the gate electrode 108 and the dummy gate electrode 109 are included in the n-type semiconductor area 105, and those located between the dummy gate electrode 109 and the device isolation insulation film 102 is included in the n-type semiconductor area 106.

Below the gate electrode 108, a p-type semiconductor area 104 is formed between the n-type semiconductor areas 131 in the surface layer portion of the p well 103. The p-type semiconductor area 104 contains, for example, boron as a p-type impurity. The concentration of holes in the p well 103 (a part of the semiconductor substrate 101) under the dummy gate electrode 109 and alongside the n-type semiconductor area 105 is lower than the concentration of majority carriers (holes) in the p-type semiconductor area 104. The p-type semiconductor area 104 is an example of a first semiconductor area, the n-type semiconductor area 105 is an example of a second semiconductor area, and the n-type semiconductor area 106 is an example of a third semiconductor area.

For example, the dummy gate electrode 109 is disposed alongside the gate electrode 108 and extends at least the entirety of a portion of the gate electrode 108 over the p-type semiconductor area 104. For example, the distance between the gate electrode 108 and the dummy gate electrode 109 is constant throughout the entirety of the portion of the gate electrode 108 over the p-type semiconductor area 104. The distance between the gate electrode 108 and one of the dummy gate electrodes 109 may be the same as or different from the distance between the gate electrode 108 and the other of the dummy gate electrodes 109.

Silicide layers 133 are formed on the n-type semiconductor areas 132. The silicide layers 133 are also formed on the gate electrode 108 and the dummy gate electrodes 109. The silicide layers 133 are silicide layers of, for example, cobalt (Co), nickel (Ni), tungsten (W), or titanium (Ti).

An interlayer insulating film 111 is formed over the semiconductor substrate 101 so as to cover the spacers 110 and the silicide layers 133. Contact holes reaching the silicide layer 133 on the n-type semiconductor area 105 and a contact hole reaching the silicide layer 133 on the gate electrode 108 are formed in the interlayer insulating film 111. Conductive plugs 112 are embedded in the contact holes reaching the silicide layer 133 on the n-type semiconductor area 105. A conductive plug 113 is embedded in the contact hole reaching the silicide layer 133 on the gate electrode 108. The conductive plugs 112 and 113 are, for example, tungsten plugs. Interconnects 114 connected to the conductive plugs 112 and an interconnect 115 connected to the conductive plug 113 are formed on the interlayer insulating film 111.

For example, a signal is applied to the gate electrode 108 through the interconnect 115. One of the interconnects 114 is applied with a drain voltage of the transistor including the gate electrode 108, and the other of the interconnects 114 is applied with a source voltage. For example, the potential of the n-type semiconductor area 106 is floating.

In the semiconductor device 100 according to the first embodiment, as described above, the concentration of holes in the p well 103 under the dummy gate electrode 109 and alongside the n-type semiconductor area 105 is lower than the concentration of holes in the p-type semiconductor area 104. Therefore, a depletion layer from the pn junction between the n-type semiconductor area 105 and the p well 103 under the dummy gate electrode 109 extends more easily than a depletion layer from the pn junction between the n-type semiconductor area 105 and the p-type semiconductor area 104 under the gate electrode 108. Therefore, though the electric field of the pn junction under the dummy gate electrode 109 is affected by the electric field from the dummy gate electrode 109 that is given a potential by the potential distribution around the dummy gate electrode 109, the electric field of the pn junction under the dummy gate electrode 109 can be more suppressed than the electric field of the pn junction under the gate electrode 108, and the junction leakage current can be suppressed.

Next, a manufacturing method for manufacturing the semiconductor device 100 according to the first embodiment will be described. FIG. 2A to FIG. 2F are cross sectional views illustrating the manufacturing method for manufacturing the semiconductor device according to the first embodiment.

Figure 2A:
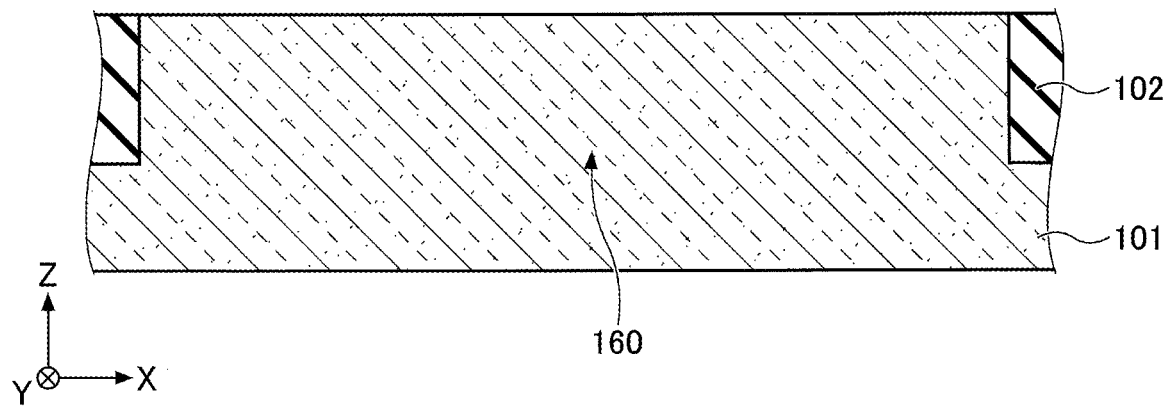
FIG. 2A is a cross sectional view (part 1) illustrating a manufacturing method for manufacturing the semiconductor device according to the first embodiment.

First, as illustrated in FIG. 2A, the device isolation insulation film 102 that defines a device active area 160 is formed in the surface layer portion of the semiconductor substrate 101. The device isolation insulation film 102 can be formed by, for example, an STI (shallow trench isolation) method.

Figure 2B:
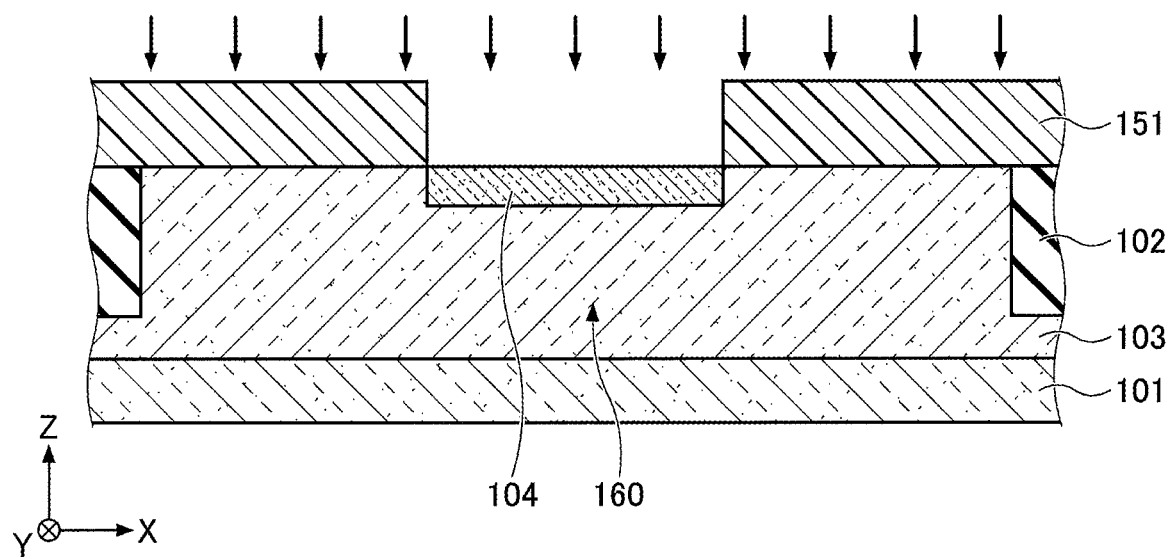
FIG. 2B is a cross sectional view (part 2) illustrating the manufacturing method for manufacturing the semiconductor device according to the first embodiment.

Next, as illustrated in FIG. 2B, the p well 103 is formed so as to include the device active area 160. For example, the p well 103 can be formed by forming a mask of photoresist (not illustrated), having an opening for the device active area 160, over the semiconductor substrate 101, and performing ion-implantation of a p-type impurity using the mask. For example, boron is ion-implanted as the p-type impurity at an energy of 100 keV to 300 keV and a dose of $1.0 \times 10^{13}$ cm$^{-2}$ to $3.0 \times 10^{14}$ cm$^{-2}$. The mask is removed after the ion implantation of the p-type impurity. For example, when the semiconductor substrate 101 is a p-type and has a desired concentration, formation of the p well 103 can be omitted, and the semiconductor substrate 101 can also serve as a p-type area to operate as the p well 103. In that case, "p well 103" in this specification may read as "semiconductor substrate 101" as appropriate.

Thereafter, likewise, as illustrated in FIG. 2B, for example, the p-type semiconductor area 104 can be formed in the surface layer portion of the p well 103 by forming a mask 151 of photoresist, having an opening for forming the p-type semiconductor area 104, over the semiconductor substrate 101, and performing ion-implantation of a p-type impurity using the mask 151. For example, boron is ion-implanted as the p-type impurity at an energy of 0.3 keV to 20 keV and a dose of $1.0 \times 10^{12}$ cm$^{-2}$ to $1.0 \times 10^{14}$ cm$^{-2}$.

Figure 2C:
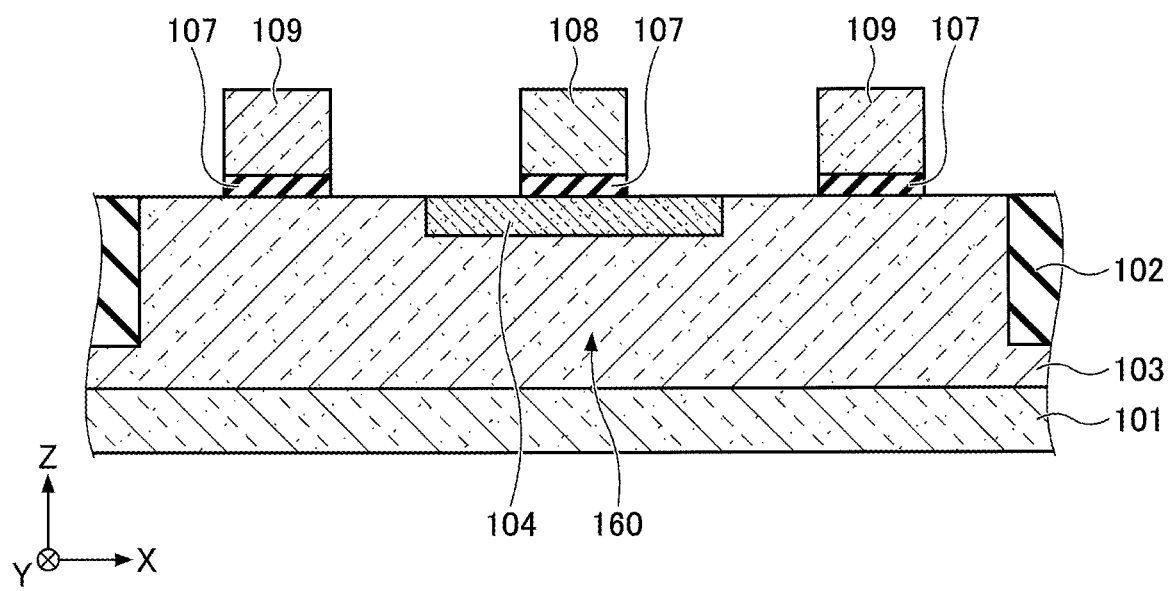
FIG. 2C is a cross sectional view (part 3) illustrating the manufacturing method for manufacturing the semiconductor device according to the first embodiment.

Next, as illustrated in FIG. 2C, the mask 151 is removed, and the gate insulating film 107, the gate electrode 108, and the dummy gate electrodes 109 are formed. For example, an insulating film and a polysilicon film are formed over the semiconductor substrate 101, and these are processed by photolithography and etching, whereby the gate insulating film 107, the gate electrode 108, and the dummy gate electrodes 109 can be formed. In the photolithography, the exposure and development of a photoresist are performed using a single exposure mask on which a pattern for the gate electrode 108 and patterns for the dummy gate electrodes 109 are formed. The gate electrode 108 is formed over the p-type semiconductor area 104. The dummy gate electrodes 109 are formed over the areas of the p well 103 where the p-type semiconductor areas 104 are not formed.

Figure 2D:
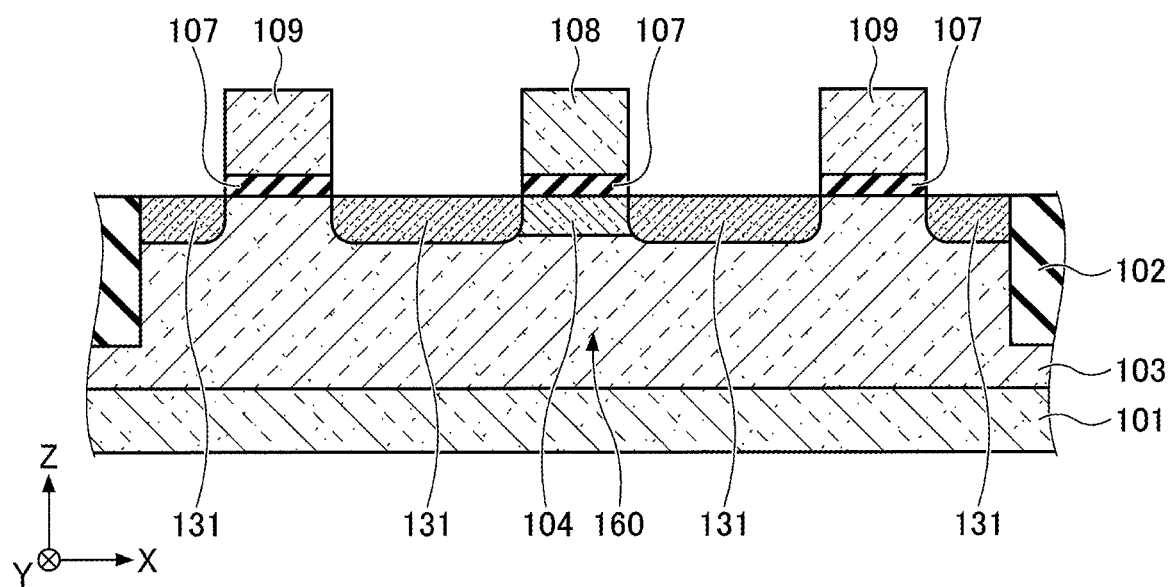
FIG. 2D is a cross sectional view (part 4) illustrating the manufacturing method for manufacturing the semiconductor device according to the first embodiment.

Next, as illustrated in FIG. 2D, in the device active area 160, the n-type semiconductor area 131 having the first impurity concentration is formed by performing ion-implantation of an n-type impurity using the gate electrode 108 and the dummy gate electrodes 109 as a mask. For example, phosphorus is ion-implanted as the n-type impurity at an energy of 5 keV to 20 keV and a dose of $1.0 \times 10^{13}$ cm$^{-2}$ to $1.0 \times 10^{15}$ cm$^{-2}$.

Figure 2E:
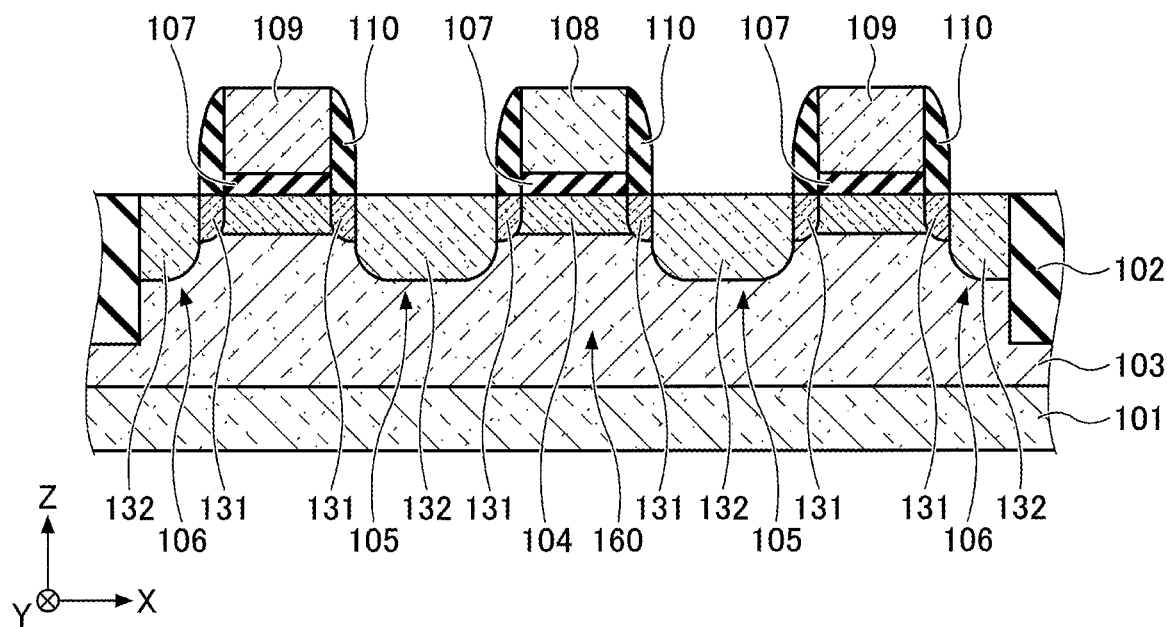
FIG. 2E is a cross sectional view (part 5) illustrating the manufacturing method for manufacturing the semiconductor device according to the first embodiment.

Thereafter, as illustrated in FIG. 2E, insulating film spacers 110 are formed on both sides of the gate electrode 108 and the dummy gate electrodes 109. Next, in the device active area 160, the n-type semiconductor area 132 having a second impurity concentration higher than the first impurity concentration is formed to be deeper than the n-type semiconductor area 131 by performing ion-implantation of an n-type impurity using the spacers 110, the gate electrode 108, and the dummy gate electrodes 109 as a mask. For example, phosphorus is ion-implanted as the n-type impurity at an energy of 5 keV to 30 keV and a dose of $1.0 \times 10^{15}$ cm$^{-2}$ to $3.0 \times 10^{16}$ cm$^{-2}$. In the top view, the n-type semiconductor areas 131 and 132 located between the gate electrode 108 and the dummy gate electrodes 109 constitute the n-type semiconductor area 105, and the n-type semiconductor areas 131 and 132 located at the side opposite to the gate electrode 108 with respect to the dummy gate electrode 109 constitute the n-type semiconductor area 106.

Figure 2F:
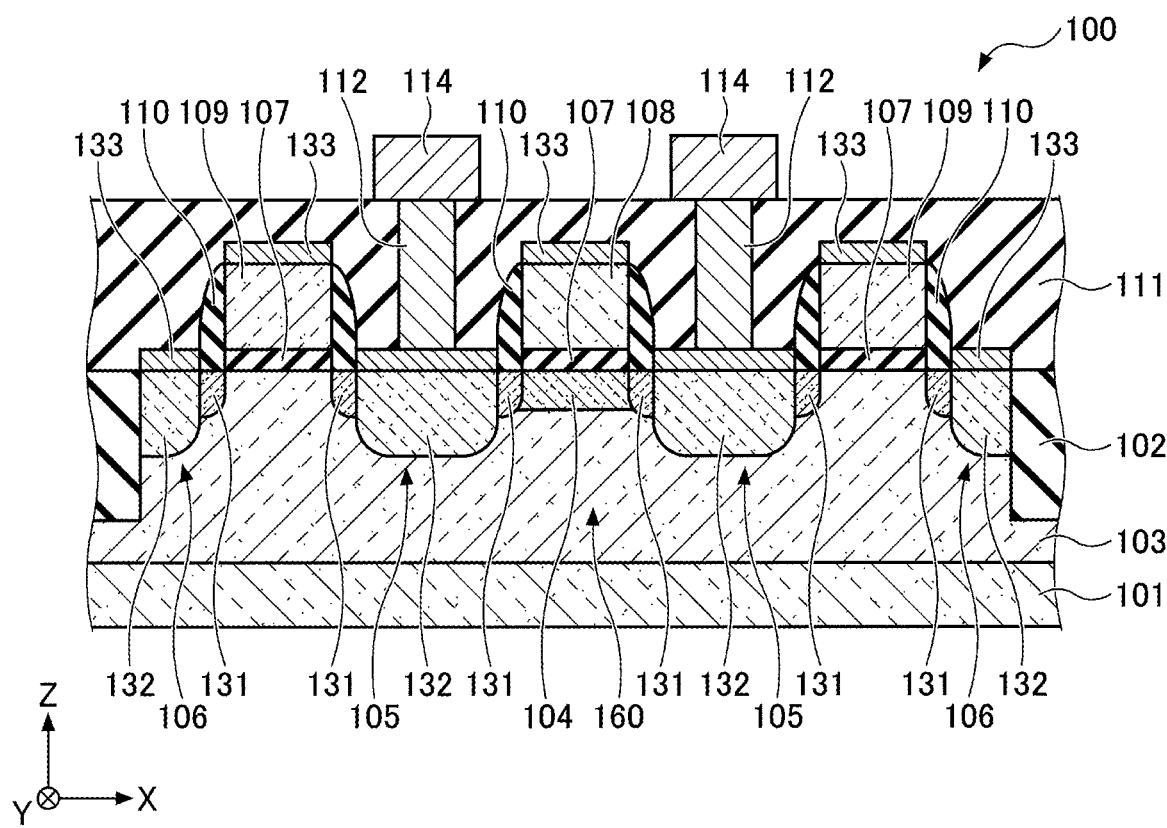
FIG. 2F is a cross sectional view (part 6) illustrating the manufacturing method for manufacturing the semiconductor device according to the first embodiment.

Next, as illustrated in FIG. 2F, the silicide layers 133 are formed on the n-type semiconductor area 132, the gate electrode 108, and the dummy gate electrodes 109. Thereafter, the interlayer insulating film 111 is formed over the semiconductor substrate 101, and the surface thereof is smoothed by a chemical mechanical polishing (CMP) method or the like. Next, the contact holes reaching the silicide layer 133 on the n-type semiconductor area 105 and the contact hole reaching the silicide layer 133 on the gate electrode 108 are formed in the interlayer insulating film 111, and conductive films are formed in these contact holes. As a result, the conductive plugs 112 connected to the silicide layer 133 on the n-type semiconductor area 105 and the conductive plug 113 (see FIG. 1A) connected to the silicide layer 133 on the gate electrode 108 are formed. Next, the interconnects 114 connected to the conductive plugs 112 and the interconnect 115 connected to the conductive plug 113 are formed on the interlayer insulating film 111.

Then, if necessary, interconnects or the like on an upper layer are formed to complete the semiconductor device 100.

In this manufacturing method, in the photolithography for forming the gate electrode 108 and the dummy gate electrodes 109, the photoresist is exposed and developed using a single exposure mask on which the pattern for the gate electrode 108 and the patterns for the dummy gate electrodes 109 are formed. Therefore, even when the gate electrode 108 of an actually-operated transistor is formed in an area where the pattern density is low, the pattern density is supplemented by the patterns for the dummy gate electrodes 109, which can increase the pattern density uniformity of the exposure mask. Therefore, the processing accuracy of the gate electrode 108 is less affected by the pattern density.

Figure 3:
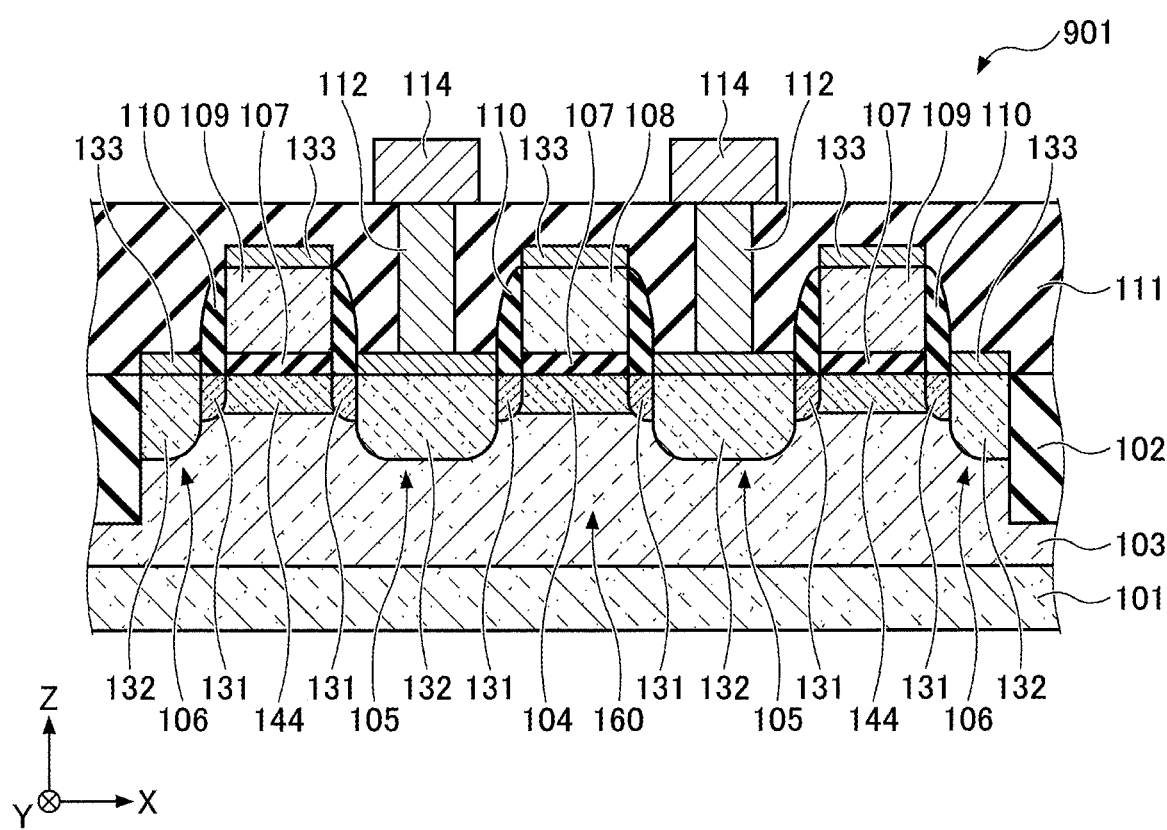
FIG. 3 is a cross sectional view illustrating a semiconductor device according to a first reference example.
Figure 4:
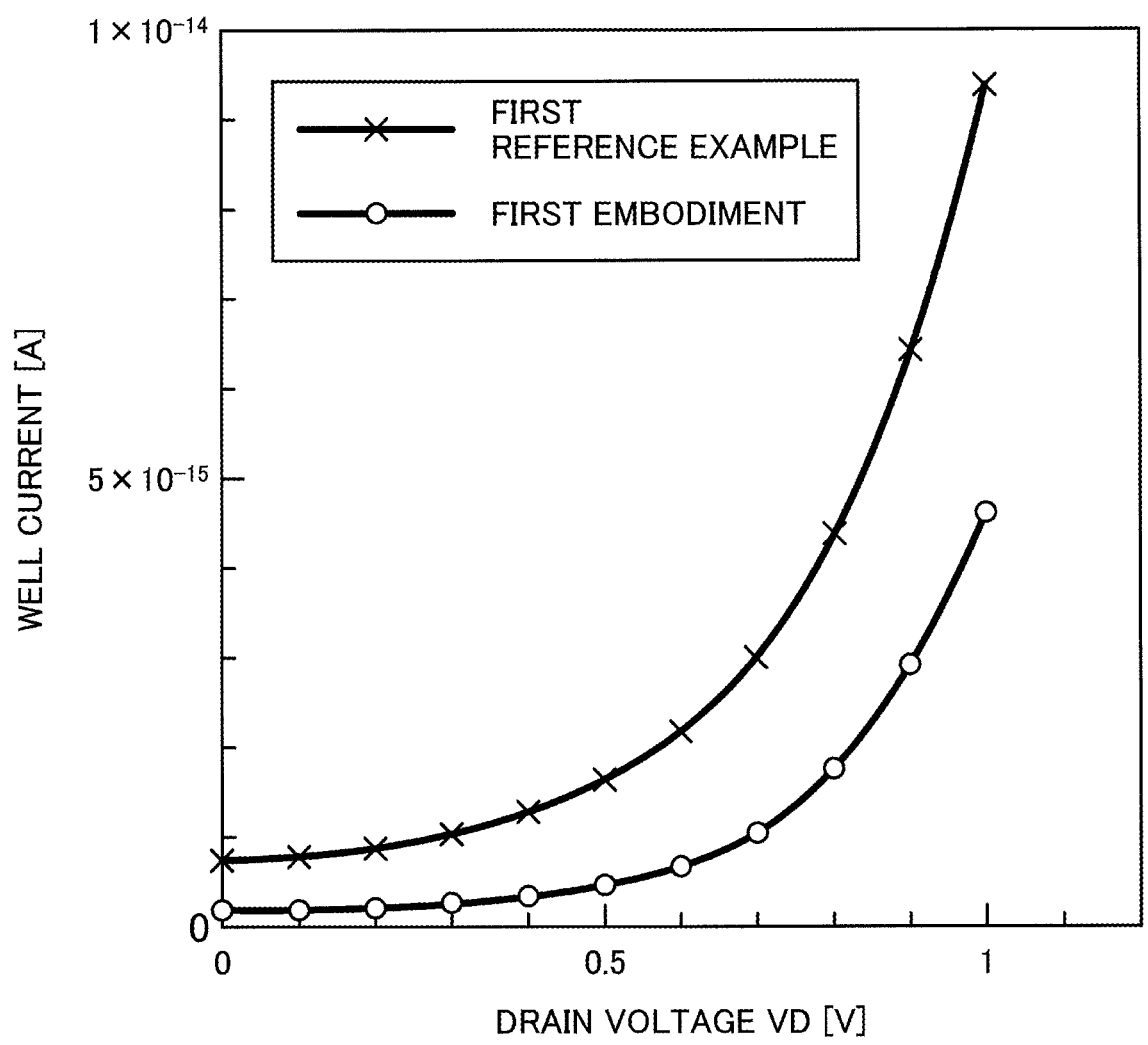
FIG. 4 is a drawing illustrating a result of simulation according to the first embodiment.

Here, the effect of the first embodiment will be described in comparison with a first reference example. FIG. 3 is a cross sectional view illustrating a semiconductor device according to the first reference example. FIG. 4 is a drawing illustrating a result of simulation according to the first embodiment.

As illustrated in FIG. 3, in a semiconductor device 901 according to the first reference example, p-type semiconductor areas 144 are formed in the surface layer portion of the p well 103 under the dummy gate electrodes 109. The p-type semiconductor areas 144 are formed at the same time as the p-type semiconductor area 104, and contains the same p-type impurity as the p-type semiconductor area 104 with the same concentration profile. Other configurations are similar to those of the first embodiment.

For example, in this simulation, boron is ion-implanted at an energy of 10 keV and a dose of $1.0 \times 10^{13}$ cm$^{-2}$ to form the p-type semiconductor areas 104 and 144. The gate length of the gate electrode 108 and the dummy gate electrodes 109 is assumed to be 60 nm, the gate width is assumed to be 1.0 μm, and the distance between the gate electrode 108 and the dummy gate electrode 109 in the X direction is 200 nm. Further, a gate voltage VG of 0 V is applied to the gate electrode 108, and a bias voltage VB of –0.5 V is applied to the p well 103 through the semiconductor substrate 101. The potentials of the dummy gate electrodes 109 and the n-type semiconductor area 106 are floating. A source voltage VS of 0 V is applied to one of the two interconnects 114, and a drain voltage VD of 0 V to 1.0 V is applied to the other of the two interconnects 114.

Then, a well current flowing between the p well 103 and the n-type semiconductor area 105 connected to the interconnect 114 to which the drain voltage VD is applied is calculated as a junction leakage current. FIG. 4 illustrates the calculation result. The horizontal axis of FIG. 4 represents the drain voltage VD, and the vertical axis represents the well current.

As illustrated in FIG. 4, according to the first embodiment, the well current can be significantly reduced from the first reference example. This is because the electric field of the pn junctions under the dummy gate electrodes 109 is suppressed, and the junction leakage current flowing through this pn junction is reduced.

In the simulation, a bias voltage VB of –0.5 V is applied. This is because the transistor is assumed to be used by applying a negative voltage to the substrate in order to reduce the subthreshold leakage current between the source and the drain. Where the bias voltage VB is a negative voltage, the potential difference between the substrate and the drain is larger than the potential difference between the substrate and the drain where the bias voltage is 0 V, so that the junction leakage current increases. In this simulation, such a situation is assumed, and a negative voltage of –0.5 V is used as the bias voltage.

Second Embodiment

Figure 5:
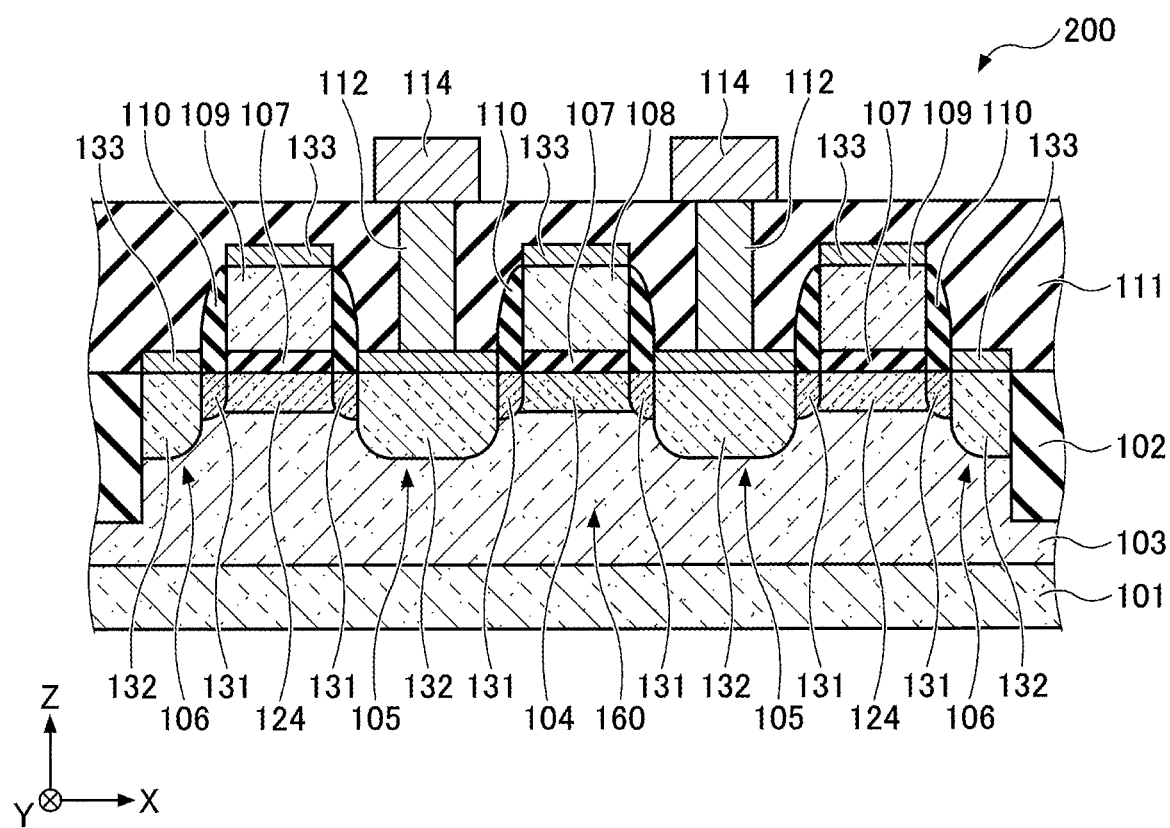
FIG. 5 is a cross sectional view illustrating a semiconductor device according to a second embodiment.

Next, the second embodiment will be described. FIG. 5 is a cross sectional view illustrating a semiconductor device according to the second embodiment. The positional relationship among a device isolation insulation film, source and drain semiconductor areas, electrodes, and interconnects in the second embodiment is the same as that of the first embodiment, and FIG. 5 is a cross sectional view taken along line I-I of FIG. 1A.

In a semiconductor device 200 according to the second embodiment, as illustrated in FIG. 5, p-type semiconductor areas 124 are formed in the surface layer portion of the p well 103 under the dummy gate electrodes 109. The p-type semiconductor area 124 contains a p-type impurity at a lower concentration than that in the p-type semiconductor area 104. The concentration of holes in the p-type semiconductor area 124 is lower than the concentration of holes in the p-type semiconductor area 104. Other configurations are the same as those in the first embodiment.

In the semiconductor device 200 according to the second embodiment, the concentration of holes in the p-type semiconductor area 124 is lower than the concentration of holes in the p-type semiconductor area 104. Therefore, a depletion layer from the pn junction between the n-type semiconductor area 105 and the p-type semiconductor area 124 under the dummy gate electrode 109 extends more easily than a depletion layer from the pn junction between the n-type semiconductor area 105 and the p-type semiconductor area 104 under the gate electrode 108. Therefore, though the electric field of the pn junction under the dummy gate electrode 109 is affected by the electric field from the dummy gate electrode 109 that is given a potential by the potential distribution around the dummy gate electrode 109, the electric field of the pn junction under the dummy gate electrode 109 can be more suppressed than the electric field of the pn junction under the gate electrode 108, and the junction leakage current can be suppressed.

Next, a manufacturing method for manufacturing the semiconductor device 200 according to the second embodiment will be described. FIG. 6A to FIG. 6D are cross sectional views illustrating the manufacturing method for manufacturing the semiconductor device according to the second embodiment.

Figure 6A:
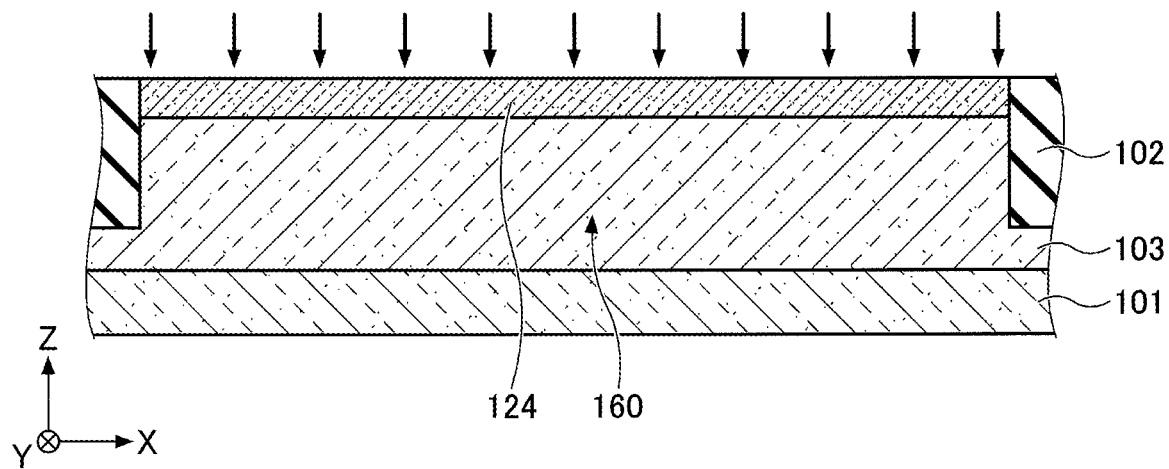
FIG. 6A is a cross sectional view (part 1) illustrating a manufacturing method for manufacturing the semiconductor device according to the second embodiment.

First, as illustrated in FIG. 6A, processing up to the formation of the p well 103 is performed in a manner similar to the first embodiment. Next, the p-type semiconductor area 124 is formed in the surface layer portion of the p well 103 by performing ion-implantation of a p-type impurity using the mask used for forming the p well 103. For example, boron is ion-implanted as the p-type impurity at an energy of 0.3 keV to 20 keV and a dose of less than $1.0 \times 10^{13}$ cm$^{-2}$. The mask is removed after the ion implantation of the p-type impurity.

Figure 6B:
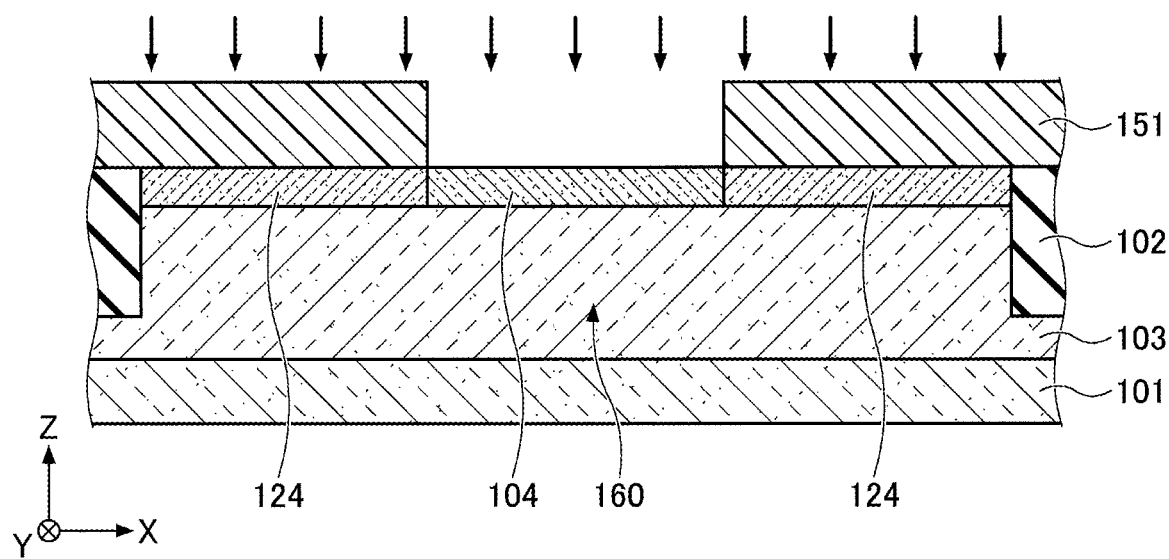
FIG. 6B is a cross sectional view (part 2) illustrating the manufacturing method for manufacturing the semiconductor device according to the second embodiment.

Thereafter, as illustrated in FIG. 6B, a mask 151 of photoresist having an opening for forming the p-type semiconductor area 104 is formed over the semiconductor substrate 101, and the p-type semiconductor area 104 is formed in the surface layer portion of the p well 103 by performing ion-implantation of a p-type impurity using the mask 151. For example, boron is ion-implanted as the p-type impurity at an energy of 0.3 keV to 20 keV and a dose of $1.0 \times 10^{12}$ cm$^{-2}$ to $1.0 \times 10^{14}$ cm$^{-2}$. The p-type semiconductor area 104 includes the p-type impurity implanted by this ion implantation and the p-type impurity implanted when the p-type semiconductor area 124 is formed.

Figure 6C:
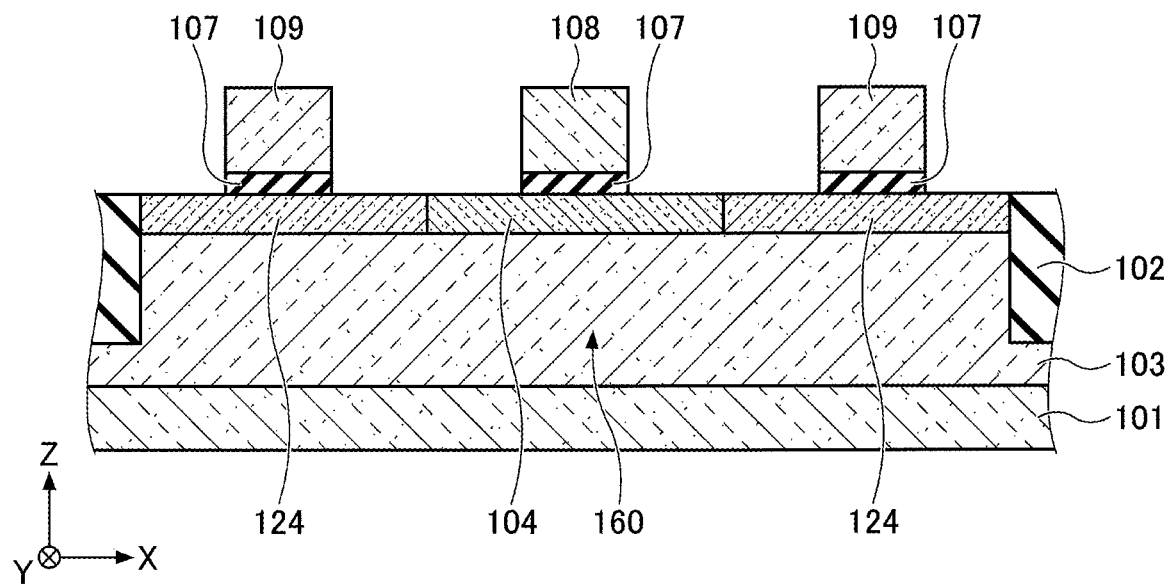
FIG. 6C is a cross sectional view (part 3) illustrating the manufacturing method for manufacturing the semiconductor device according to the second embodiment.

Next, as illustrated in FIG. 6C, the mask 151 is removed, and the gate insulating film 107, the gate electrode 108, and the dummy gate electrodes 109 are formed. The gate electrode 108 is formed over the p-type semiconductor area 104, and the dummy gate electrodes 109 are formed over the p-type semiconductor areas 124. In a manner similar to the first embodiment, in the photolithography for forming the gate electrode 108 and the dummy gate electrodes 109, the photoresist is exposed and developed using a single exposure mask on which the pattern for the gate electrode 108 and the patterns for the dummy gate electrodes 109 are formed.

Figure 6D:
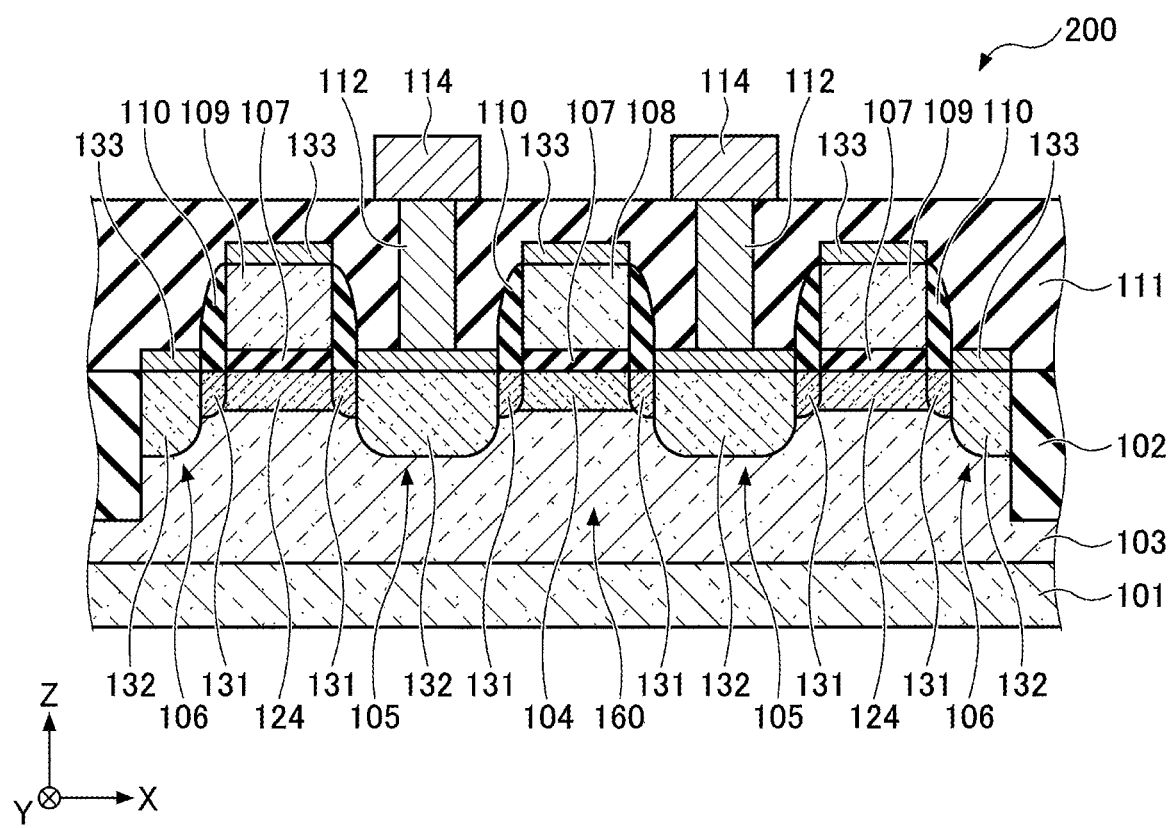
FIG. 6D is a cross sectional view (part 4) illustrating the manufacturing method for manufacturing the semiconductor device according to the second embodiment.

Next, as illustrated in FIG. 6D, the semiconductor device 200 is completed by performing the processing of the formation of the n-type semiconductor areas 131 and subsequent processing in a manner similar to the first embodiment.

According to this manufacturing method, in a manner similar to the first embodiment, the processing accuracy of the gate electrode 108 is less affected by the pattern density.

Figure 7:
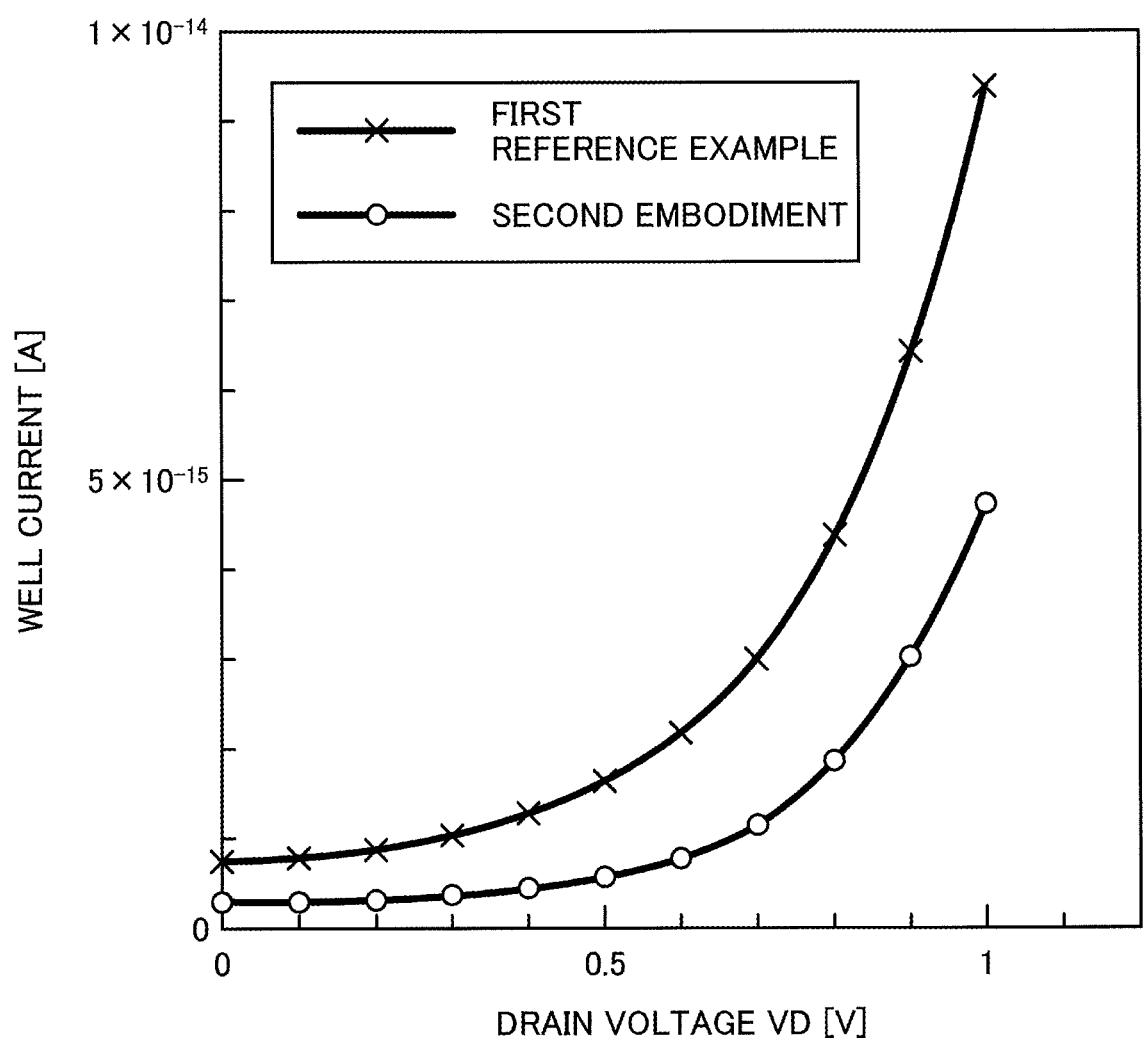
FIG. 7 is a drawing illustrating a result of simulation according to the second embodiment.

Here, the effect of the second embodiment will be described in comparison with the first reference example. FIG. 7 is a drawing illustrating a result of simulation according to the second embodiment.

In this simulation, the p-type semiconductor area 104 is formed by performing ion implantation of boron at an energy of 10 keV and a dose of $1.0 \times 10^{13}$ cm$^{-2}$ in total. Also, the p-type semiconductor area 124 is formed by performing ion implantation of boron at an energy of 10 keV and a dose of $2.0 \times 10^{12}$ cm$^{-2}$. Other conditions are the same as in the first embodiment.

Then, a well current flowing between the p well 103 and the n-type semiconductor area 105 connected to the interconnect 114 to which the drain voltage VD is applied is calculated as a junction leakage current. FIG. 7 illustrates the calculation result. The horizontal axis of FIG. 7 represents the drain voltage VD, and the vertical axis represents the well current.

As illustrated in FIG. 7, according to the second embodiment, the well current can also be significantly reduced from the first reference example. This is because the electric field of the pn junctions under the dummy gate electrodes 109 is suppressed, and the junction leakage current flowing through this pn junction is reduced.

Third Embodiment

Figure 8:
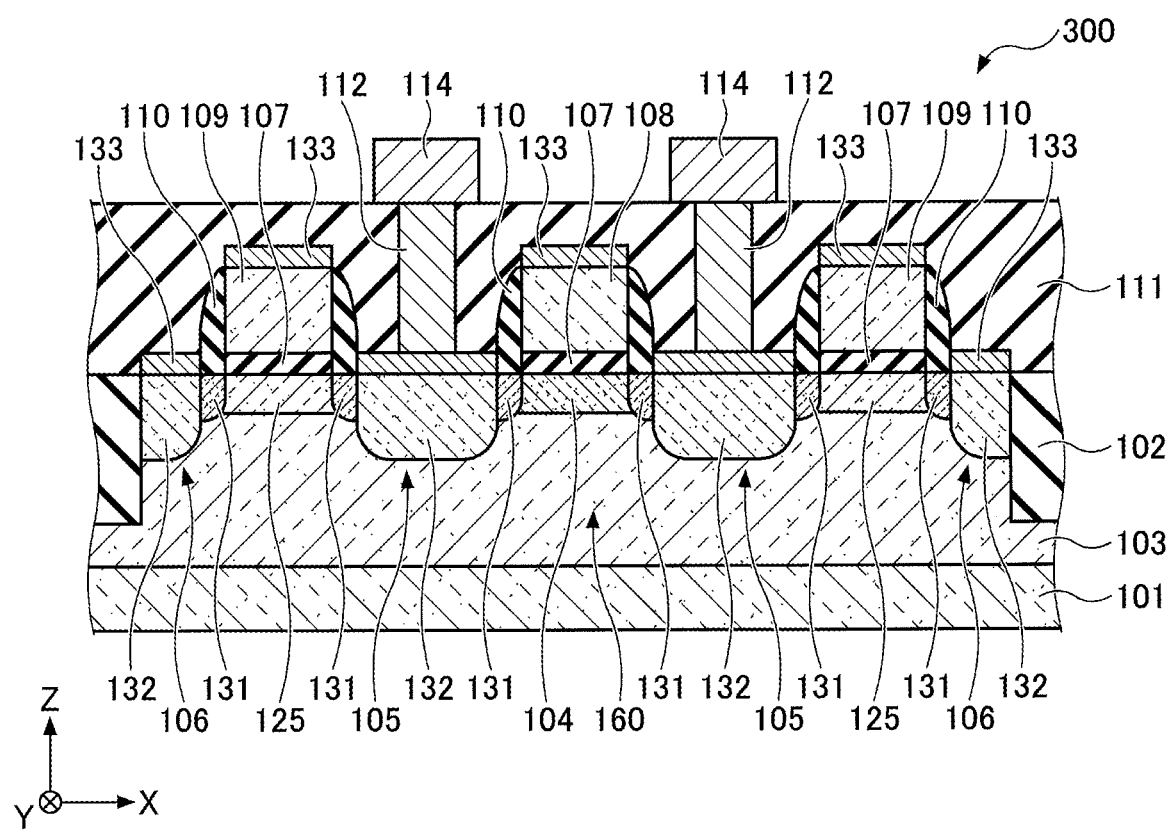
FIG. 8 is a cross sectional view illustrating a semiconductor device according to a third embodiment.

Next, the third embodiment will be described. FIG. 8 is a cross sectional view illustrating a semiconductor device according to the third embodiment. The positional relationship among a device isolation insulation film, source and drain semiconductor areas, electrodes, and interconnects in the third embodiment is the same as that of the first embodiment, and FIG. 8 is a cross sectional view taken along line I-I of FIG. 1A.

In a semiconductor device 300 according to the third embodiment, as illustrated in FIG. 8, n-type semiconductor areas 125 are formed in the surface layer portion of the p well 103 under the dummy gate electrodes 109. For example, the n-type semiconductor areas 125 contain phosphorus as an n-type impurity. Other configurations are similar to those of the first embodiment. The n-type semiconductor area 125 is an example of a fourth semiconductor area.

In the semiconductor device 300 according to the third embodiment, there is no pn junction between the n-type semiconductor area 125 and the n-type semiconductor area 105. The n-type semiconductor area 125 includes holes as minority carriers, but the concentration of holes in the n-type semiconductor area 125 is lower than the concentration of holes in the p-type semiconductor area 104. Furthermore, the concentration of holes in the p well 103 under the dummy gate electrode 109 and alongside the n-type semiconductor area 105 is lower than the concentration of holes in the p-type semiconductor area 104. Therefore, though the electric field of the pn junction under the dummy gate electrode 109 is affected by the electric field from the dummy gate electrode 109 that is given a potential by the potential distribution around the dummy gate electrode 109, the electric field of the pn junction under the dummy gate electrode 109 can be more suppressed than the electric field of the pn junction under the gate electrode 108, and the junction leakage current can be suppressed.

Next, a manufacturing method for manufacturing the semiconductor device 300 according to the third embodiment will be described. FIG. 9A to FIG. 9D are cross sectional views illustrating the manufacturing method for manufacturing the semiconductor device according to the third embodiment.

Figure 9A:
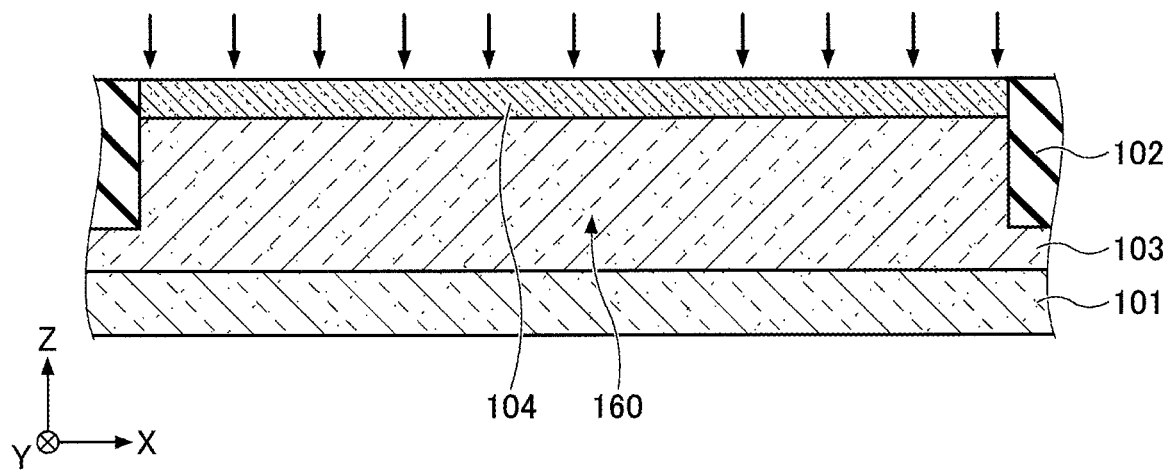
FIG. 9A is a cross sectional view (part 1) illustrating a manufacturing method for manufacturing the semiconductor device according to the third embodiment.

First, as illustrated in FIG. 9A, processing up to the formation of the p well 103 is performed in a manner similar to the first embodiment. Next, the p-type semiconductor area 104 is formed in the surface layer portion of the p well 103 by performing ion-implantation of a p-type impurity using the mask used for forming the p well 103. For example, boron is ion-implanted as the p-type impurity at an energy of 0.3 keV to 20 keV and a dose of $1.0 \times 10^{12}$ cm$^{-2}$ to $1.0 \times 10^{14}$ cm$^{-2}$. The mask is removed after the ion implantation of the p-type impurity.

Figure 9B:
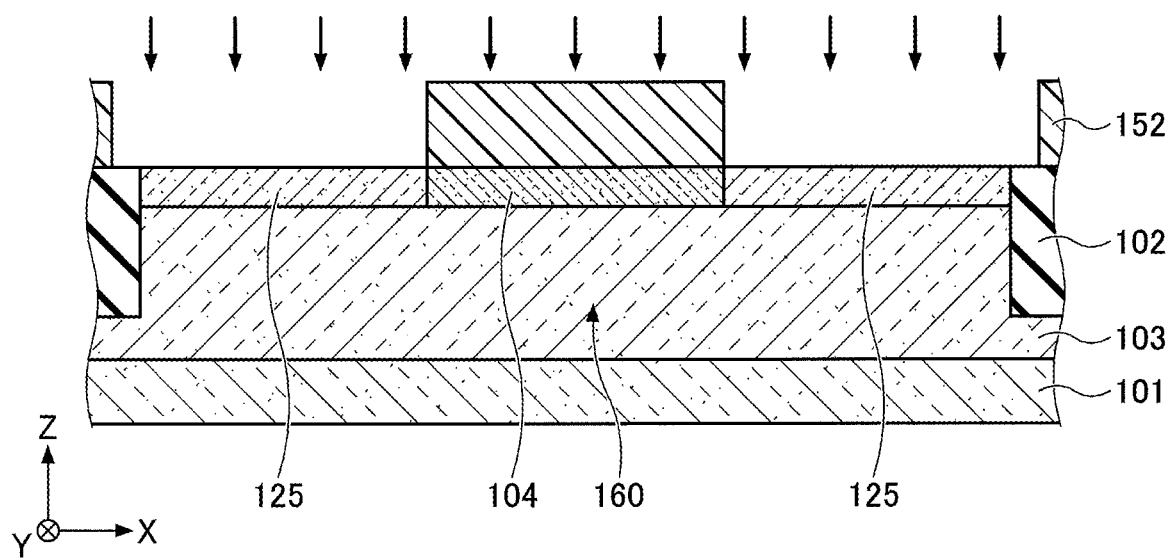
FIG. 9B is a cross sectional view (part 2) illustrating the manufacturing method for manufacturing the semiconductor device according to the third embodiment.

Thereafter, as illustrated in FIG. 9B, a mask 152 of photoresist having openings for forming the n-type semiconductor areas 125 is formed over the semiconductor substrate 101, and the n-type semiconductor areas 125 are formed in the surface layer portion of the p well 103 by performing ion-implantation of an n-type impurity using the mask 152. For example, phosphorus is ion-implanted as the n-type impurity at an energy of 5 keV to 30 keV and a dose of $1.0 \times 10^{12}$ cm$^{-2}$ to $1.0 \times 10^{14}$ cm$^{-2}$. The n-type semiconductor area 125 also contains a p-type impurity, but since the electron concentration exceeds the hole concentration, the conductive type is reversed from the p-type to the n-type. When a p-channel type transistor is formed on the semiconductor substrate 101, the n-type semiconductor area 125 may be formed simultaneously with ion implantation for adjusting the threshold voltage of the p-channel type transistor.

Figure 9C:
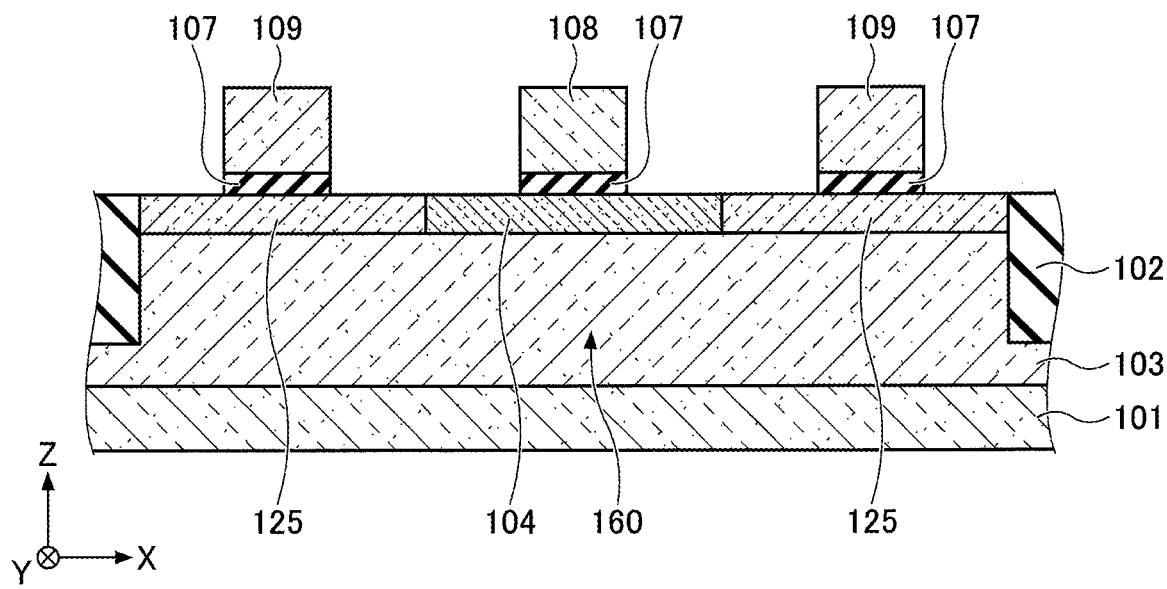
FIG. 9C is a cross sectional view (part 3) illustrating the manufacturing method for manufacturing the semiconductor device according to the third embodiment.

Next, as illustrated in FIG. 9C, the mask 152 is removed, and the gate insulating film 107, the gate electrode 108, and the dummy gate electrodes 109 are formed. The gate electrode 108 is formed over the p-type semiconductor area 104, and the dummy gate electrodes 109 are formed over the n-type semiconductor areas 125. In a manner similar to the first embodiment, in the photolithography for forming the gate electrode 108 and the dummy gate electrodes 109, the photoresist is exposed and developed using a single exposure mask on which the pattern for the gate electrode 108 and the patterns for the dummy gate electrodes 109 are formed.

Figure 9D:
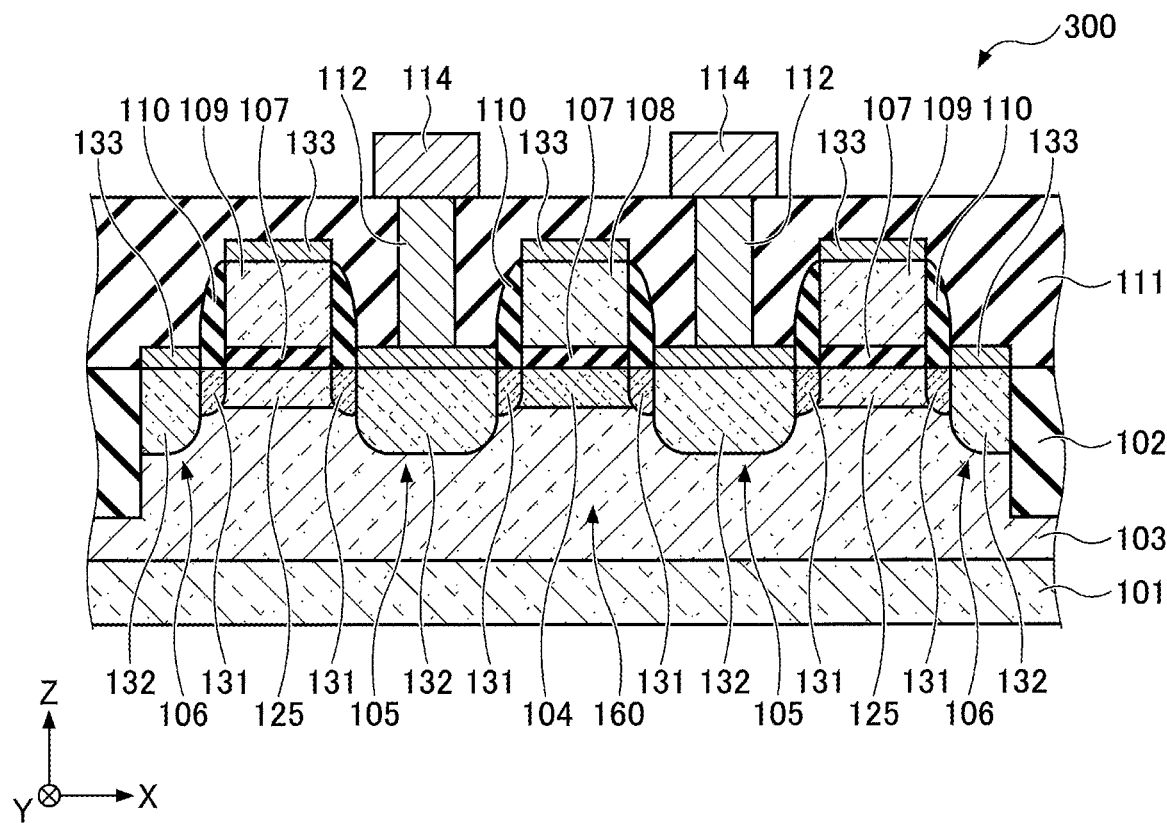
FIG. 9D is a cross sectional view (part 4) illustrating the manufacturing method for manufacturing the semiconductor device according to the third embodiment.

Next, as illustrated in FIG. 9D, the semiconductor device 300 is completed by performing the processing of the formation of the n-type semiconductor areas 131 and subsequent processing in a manner similar to the first embodiment.

According to this manufacturing method, in a manner similar to the first embodiment, the processing accuracy of the gate electrode 108 is less affected by the pattern density.

Figure 10:
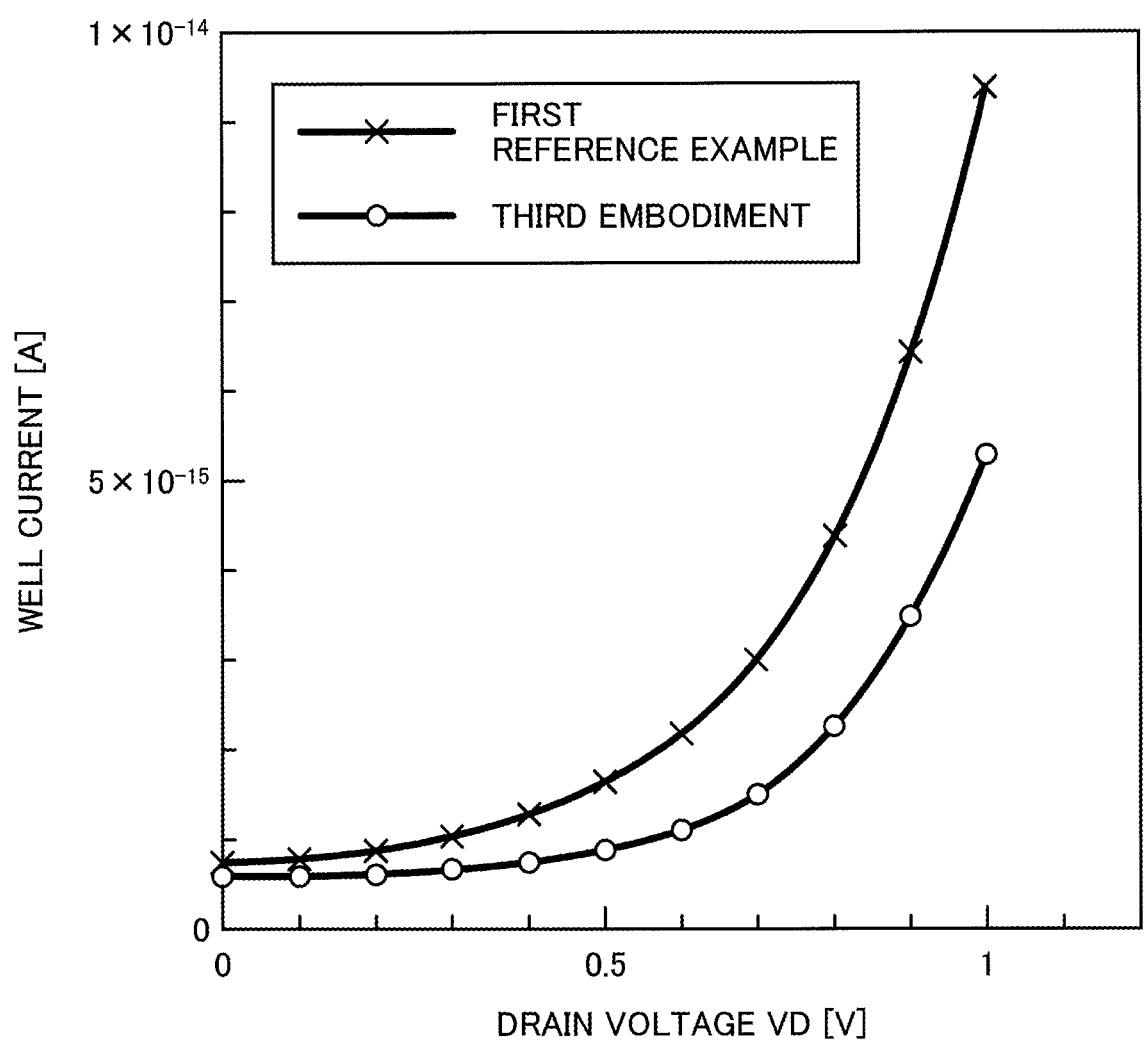
FIG. 10 is a drawing illustrating a result of simulation according to the third embodiment.

Here, the effect of the third embodiment will be described in comparison with the first reference example. FIG. 10 is a drawing illustrating a result of simulation according to the third embodiment.

In this simulation, the p-type semiconductor area 104 is formed by performing ion implantation of boron at an energy of 10 keV and a dose of $1.0 \times 10^{13}$ cm$^{-2}$. Also, the n-type semiconductor area 125 is formed by performing ion implantation of phosphorus at an energy of 15 keV and a dose of $1.1 \times 10^{13}$ cm$^{-2}$. Other conditions are the same as in the first embodiment.

Then, a well current flowing between the p well 103 and the n-type semiconductor area 105 connected to the interconnect 114 to which the drain voltage VD is applied is calculated as a junction leakage current. FIG. 10 illustrates the calculation result. In FIG. 10, the horizontal axis represents the drain voltage VD, and the vertical axis represents the well current.

As illustrated in FIG. 10, according to the third embodiment, the well current can also be significantly reduced from the first reference example. This is because, under the dummy gate electrode 109, there is no pn junction that is affected easily by the electric field from the dummy gate electrode 109, and the junction leakage current in proximity to the dummy gate electrode 109 is reduced.

Fourth Embodiment

Figure 11A:
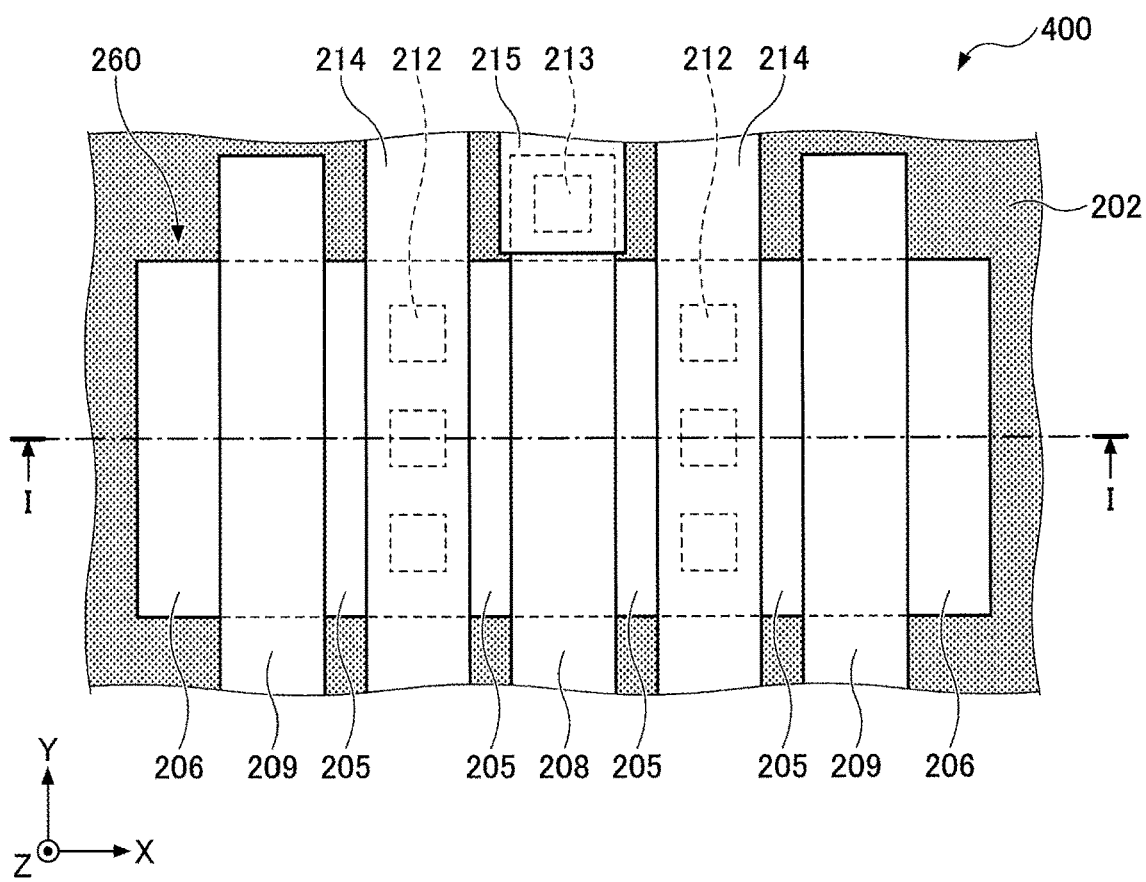
FIG. 11A is a top view illustrating a semiconductor device according to a fourth embodiment.
Figure 11B:
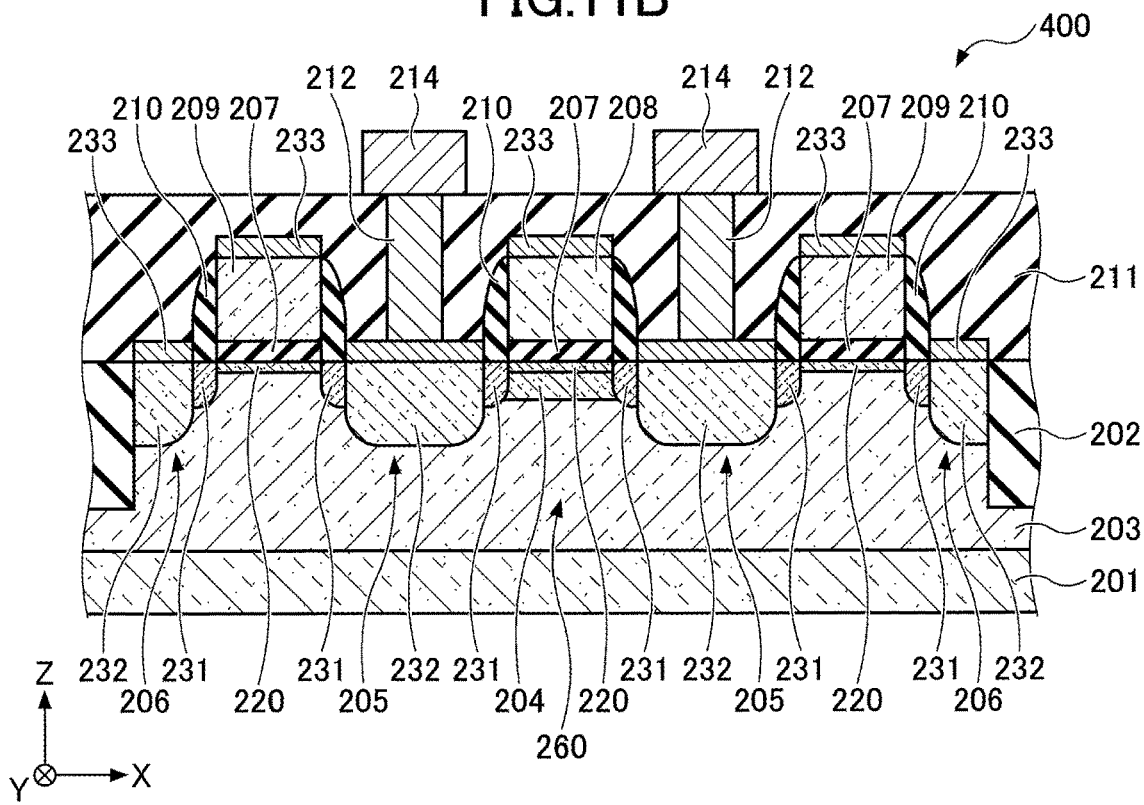
FIG. 11B is a cross sectional view illustrating the semiconductor device according to the fourth embodiment.

Next, the fourth embodiment will be explained. FIG. 11A is a top view illustrating a semiconductor device according to the fourth embodiment. FIG. 11B is a cross sectional view illustrating the semiconductor device according to the fourth embodiment. FIG. 11A mainly illustrates a positional relationship among a device isolation insulation film, source and drain semiconductor areas, electrodes, and interconnects. FIG. 11B corresponds to a cross sectional view taken along line I-I of FIG. 11A.

As illustrated in FIG. 11A and FIG. 11B, a semiconductor device 400 according to the fourth embodiment is formed with a silicon layer 220 over a p-type semiconductor substrate 201, and a device isolation insulation film 202 that defines a device active area 260 is formed in a surface layer portion of a stack of the p-type semiconductor substrate 201 and the silicon layer 220. The semiconductor substrate 201 is, for example, a silicon substrate. The silicon layer 220 is, for example, an i-type non-doped silicon layer in which no impurity is introduced intentionally. The thickness of the silicon layer 220 is, for example, 10 nm to 40 nm. For the semiconductor substrate 201, although a device active area 260 where a p-channel type transistor is formed and a device active area where an n-channel type transistor is formed both exist, FIG. 11A and FIG. 11B illustrate a device active area 260 in which an n-channel type transistor is formed. For example, the planar shape of the device active area 260 is in a rectangular shape. In the following description, a direction parallel to the long side of the device active area 260 is defined as an X direction, a direction parallel to the short side is defined as a Y direction, and a thickness direction of the semiconductor substrate 201 is defined as a Z direction. The X direction is an example of a second direction, and the Y direction is an example of a first direction.

A p well 203 is formed to include the device active area 260. For example, the p well 203 contains boron as a p-type impurity. For example, when the semiconductor substrate 201 is a p-type, the p well 203 can be omitted, and the semiconductor substrate 201 can also serve as a p-type area to operate as the p well 203. In that case, "p well 203" in this specification may read as "semiconductor substrate 201" as appropriate. One gate electrode 208 and two dummy gate electrodes 209 are formed over the p well 203. Gate insulating films 207 are formed between the gate electrode 208 and the p well 203 and between the dummy gate electrode 209 and the p well 203. The gate electrode 208 and the dummy gate electrodes 209 extend parallel to the Y direction. That is, the gate electrode 208 is located between the two dummy gate electrodes 209. For example, the thickness of the gate insulating film 207 is 1.0 nm to 10.0 nm. The thicknesses of the gate electrode 208 and the dummy gate electrodes 209 are 50 nm to 200 nm. Examples of materials of the gate insulating film 207 include insulators such as silicon oxide, silicon nitride, and hafnium oxide. Examples of materials of the gate electrode 208 and the dummy gate electrode 209 include polycrystalline silicon. Metals such as titanium and tungsten and nitrides of these metals can also be used as materials for the gate electrode 208 and the dummy gate electrode 209.

Spacers (sidewalls) 210 of insulating films are formed on both sides of the gate electrode 208 and the dummy gate electrodes 209 in the X direction. In the surface layer portion of the stack of the p well 203 and the silicon layer 220, an n-type semiconductor area 231 is formed under the spacer 210 at a first depth, and n-type semiconductor areas 232 are formed, at a second depth deeper than the first depth, in portions exposed from the spacer 210, the gate electrode 208, and the dummy gate electrodes 209. For example, the n-type semiconductor area 231 contains phosphorus as an n-type impurity at a first impurity concentration. The n-type semiconductor area 232 contains phosphorus as an n-type impurity concentration at a second impurity concentration higher than the first impurity concentration. Among the n-type semiconductor areas 231 and 232, those located between the gate electrode 208 and the dummy gate electrode 209 are included in an n-type semiconductor area 205, and those located between the dummy gate electrode 209 and the device isolation insulation film 202 is included in an n-type semiconductor area 206.

Below the gate electrode 208, a p-type semiconductor area 204 is formed between the n-type semiconductor areas 231 in the surface layer portion of the p well 203. The p-type semiconductor area 204 contains, for example, boron as a p-type impurity. The p-type semiconductor area 204 may be referred to as a screen layer. The concentration of holes in the p well 203 (a part of the semiconductor substrate 201) under the dummy gate electrode 209 and alongside the n-type semiconductor area 205 is lower than the concentration of majority carriers (holes) in the p-type semiconductor area 204. Below the gate electrode 208, the silicon layer 220 is located between the p-type semiconductor area 204 and the gate insulating film 207. Below the dummy gate electrode 209, the silicon layer 220 is located between the p well 203 and the gate insulating film 207. The p-type semiconductor area 204 is an example of a first semiconductor area, the n-type semiconductor area 205 is an example of a second semiconductor area, and the n-type semiconductor area 206 is an example of a third semiconductor area. The silicon layer 220 is an example of a fifth semiconductor area.

For example, the dummy gate electrode 209 is disposed alongside the gate electrode 208 and extends at least the entirety of a portion of the gate electrode 208 over the p-type semiconductor area 204. For example, the distance between the gate electrode 208 and the dummy gate electrode 209 is constant throughout the entirety of the portion of the gate electrode 208 over the p-type semiconductor area 204. The distance between the gate electrode 208 and one of the dummy gate electrodes 209 may be the same as or different from the distance between the gate electrode 208 and the other of the dummy gate electrodes 209.

Silicide layers 233 are formed on the n-type semiconductor areas 232. The silicide layers 233 are also formed on the gate electrode 208 and the dummy gate electrodes 209. The silicide layers 233 are silicide layers of, for example, cobalt (Co), nickel (Ni), tungsten (W), or titanium (Ti).

An interlayer insulating film 211 is formed over the semiconductor substrate 201 and the silicon layer 220 so as to cover the spacers 210 and the silicide layers 233. Contact holes reaching the silicide layer 233 on the n-type semiconductor area 205 and a contact hole reaching the silicide layer 233 on the gate electrode 208 are formed in the interlayer insulating film 211. Conductive plugs 212 are embedded in the contact holes reaching the silicide layer 233 on the n-type semiconductor area 205. A conductive plug 213 is embedded in the contact hole reaching the silicide layer 233 on the gate electrode 208. The conductive plugs 212 and 213 are, for example, tungsten plugs. Interconnects 214 connected to the conductive plugs 212 and an interconnect 215 connected to the conductive plug 213 are formed on the interlayer insulating film 211.

For example, a signal is applied to the gate electrode 208 through the interconnect 215. One of the interconnects 214 is applied with a drain voltage of a transistor including the gate electrode 208, and the other of the interconnects 214 is applied with a source voltage. For example, the potential of the n-type semiconductor area 206 is floating.

In the semiconductor device 400 according to the fourth embodiment, as described above, the concentration of holes in the p well 203 under the dummy gate electrode 209 and alongside the n-type semiconductor area 205 is lower than the concentration of holes in the p-type semiconductor area 204. Therefore, a depletion layer from the pn junction between the n-type semiconductor area 205 and the p well 203 under the dummy gate electrode 209 extends more easily than a depletion layer from the pn junction between the n-type semiconductor area 205 and the p-type semiconductor area 204 under the gate electrode 208. Therefore, though the electric field of the pn junction under the dummy gate electrode 209 is affected by the electric field from the dummy gate electrode 209 that is given a potential by the potential distribution around the dummy gate electrode 109, the electric field of the pn junction under the dummy gate electrode 209 can be more suppressed than the electric field of the pn junction under the gate electrode 208, and the junction leakage current can be suppressed.

In addition, since the silicon layer 220 which is non-doped and has a very low impurity concentration is provided under the gate insulating film 207 under the gate electrode 208, variations in characteristics due to random variations of the impurity can be suppressed.

Next, a manufacturing method for manufacturing the semiconductor device 400 according to the fourth embodiment will be described. FIG. 12A to FIG. 12F are cross sectional views illustrating the manufacturing method for manufacturing the semiconductor device according to the fourth embodiment.

Figure 12A:
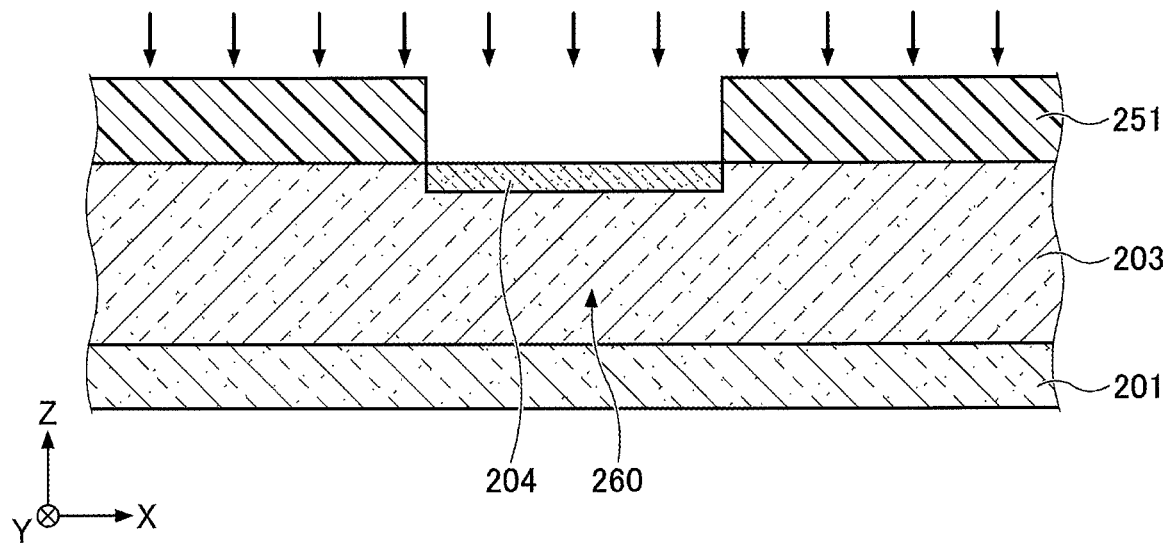
FIG. 12A is a cross sectional view (part 1) illustrating a manufacturing method for manufacturing the semiconductor device according to the fourth embodiment.

Next, as illustrated in FIG. 12A, the p well 203 is formed in the surface layer portion of the semiconductor substrate 201. For example, the p well 203 can be formed by forming a mask of photoresist (not illustrated), having an opening for a planned area where the p well 203 is to be formed, over the semiconductor substrate 201, and performing ion-implantation of a p-type impurity using the mask. For example, boron is ion-implanted as the p-type impurity at an energy of 100 keV to 300 keV and a dose of $1.0 \times 10^{13}$ cm$^{-2}$ to $3.0 \times 10^{14}$ cm$^{-2}$. The mask is removed after the ion implantation of the p-type impurity. For example, when the semiconductor substrate 201 is a p-type and has a desired concentration, formation of the p well 203 can be omitted, and the semiconductor substrate 201 can also serve as a p-type area to operate as the p well 203. In that case, "p well 203" in this specification may read as "semiconductor substrate 201" as appropriate.

Next, likewise, as illustrated in FIG. 12A, for example, the p-type semiconductor area 204 can be formed in the surface layer portion of the p well 203 by forming a mask 251 of photoresist, having an opening for forming the p-type semiconductor area 204, over the semiconductor substrate 201, and performing ion-implantation of a p-type impurity using the mask 251. For example, boron is ion-implanted as the p-type impurity at an energy of 0.3 keV to 20 keV and a dose of $1.0 \times 10^{12}$ cm$^{-2}$ to $1.0 \times 10^{14}$ cm$^{-2}$. BF$_2$ may be ion-implanted as the p-type impurity at an energy of 3 keV to 30 keV and a dose of $1.0 \times 10^{12}$ cm$^{-2}$ to $1.0 \times 10^{14}$ cm$^{-2}$.

Figure 12B:
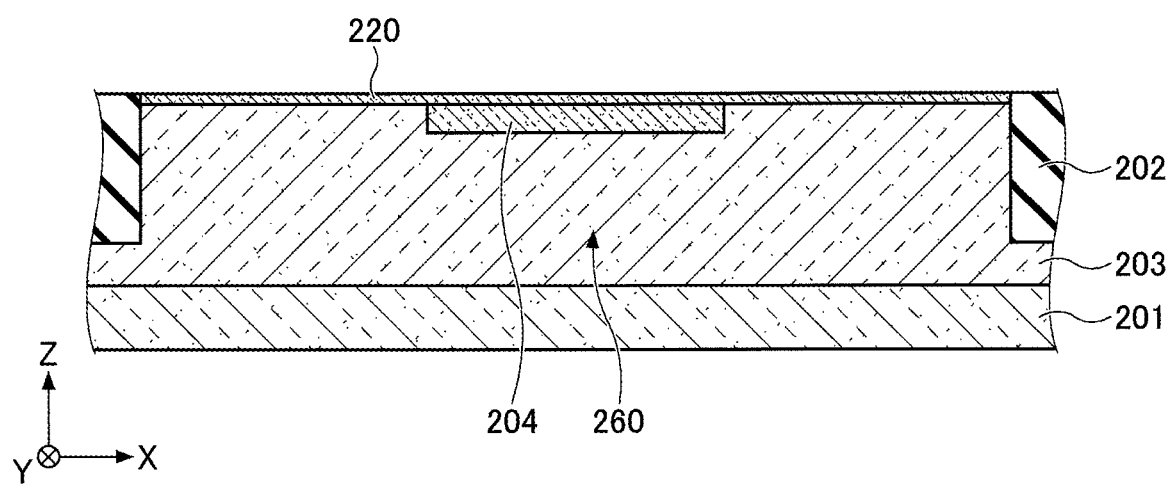
FIG. 12B is a cross sectional view (part 2) illustrating the manufacturing method for manufacturing the semiconductor device according to the fourth embodiment.

Thereafter, as illustrated in FIG. 12B, the mask 251 is removed, and the silicon layer 220 is formed over the semiconductor substrate 201. The silicon layer 220 can be formed by, for example, epitaxial growth. Next, the device isolation insulation film 202 that defines the device active area 260 is formed in the surface layer portion of the stack of the semiconductor substrate 201 and the silicon layer 220. The device isolation insulation film 202 can be formed by, for example, the STI method.

Figure 12C:
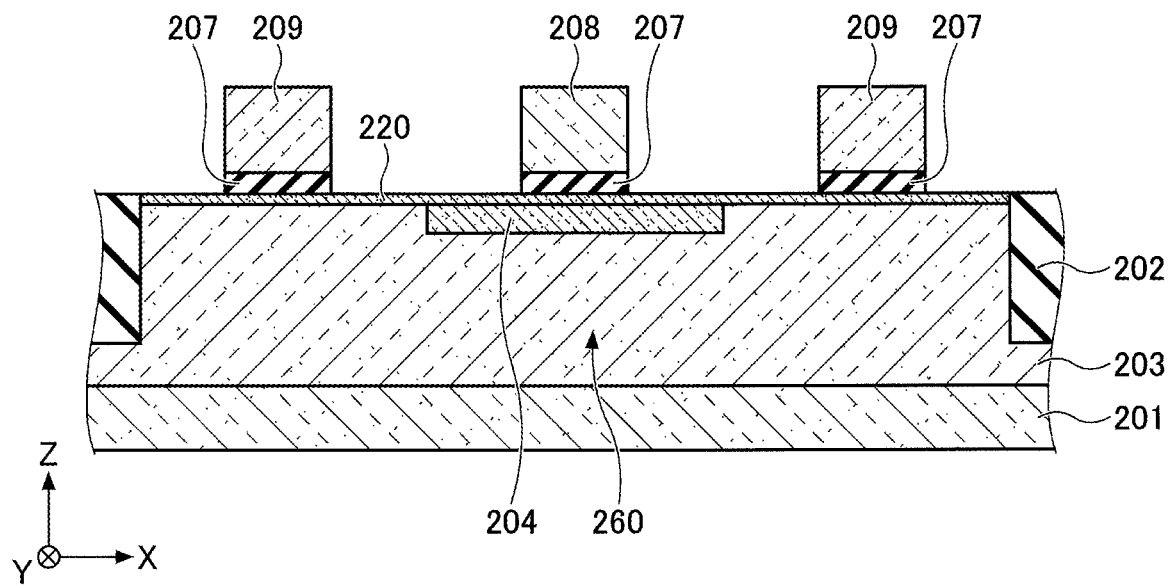
FIG. 12C is a cross sectional view (part 3) illustrating the manufacturing method for manufacturing the semiconductor device according to the fourth embodiment.

Next, as illustrated in FIG. 12C, the gate insulating film 207, the gate electrode 208, and the dummy gate electrodes 209 are formed. For example, an insulating film and a polysilicon film are formed on the semiconductor substrate 201, and these are processed by photolithography and etching, whereby the gate insulating film 207, the gate electrode 208, and the dummy gate electrode 209 can be formed. In the photolithography, the exposure and development of a photoresist are performed using a single exposure mask on which a pattern for the gate electrode 208 and patterns for the dummy gate electrodes 209 are formed. The gate electrode 208 is formed over the p-type semiconductor area 204. The dummy gate electrodes 209 are formed over the areas of the p well 203 where the p-type semiconductor areas 204 are not formed.

Figure 12D:
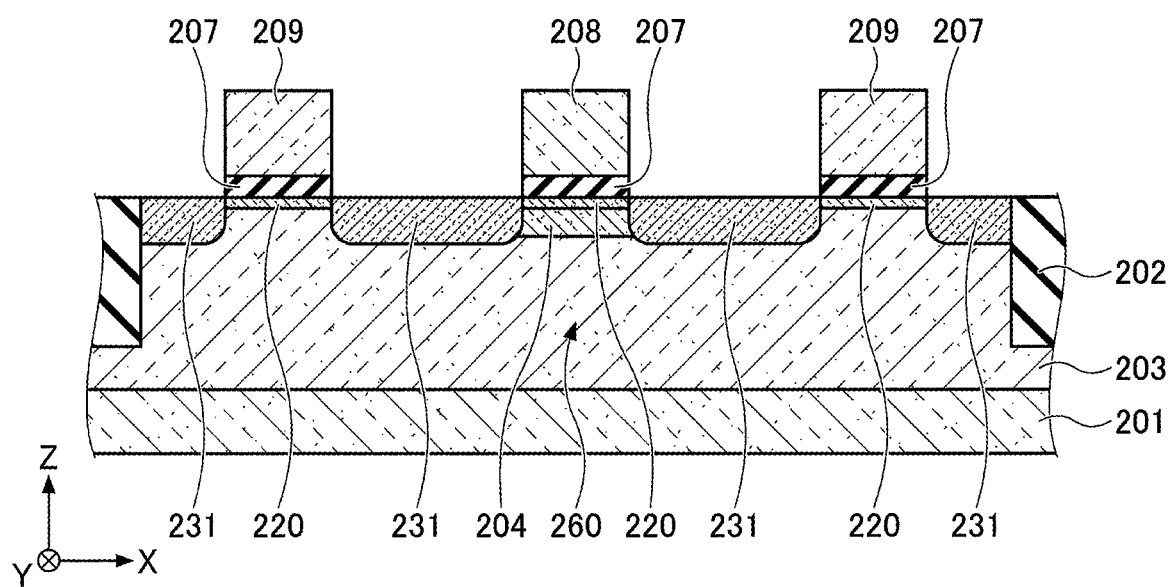
FIG. 12D is a cross sectional view (part 4) illustrating the manufacturing method for manufacturing the semiconductor device according to the fourth embodiment.

Next, as illustrated in FIG. 12D, in the device active area 260, the n-type semiconductor area 231 having the first impurity concentration is formed by performing ion-implantation of an n-type impurity using the gate electrode 208 and the dummy gate electrodes 209 as a mask. For example, phosphorus is ion-implanted as the n-type impurity at an energy of 5 keV to 20 keV and a dose of $1.0 \times 10^{13}$ cm$^{-2}$ to $1.0 \times 10^{15}$ cm$^{-2}$.

Figure 12E:
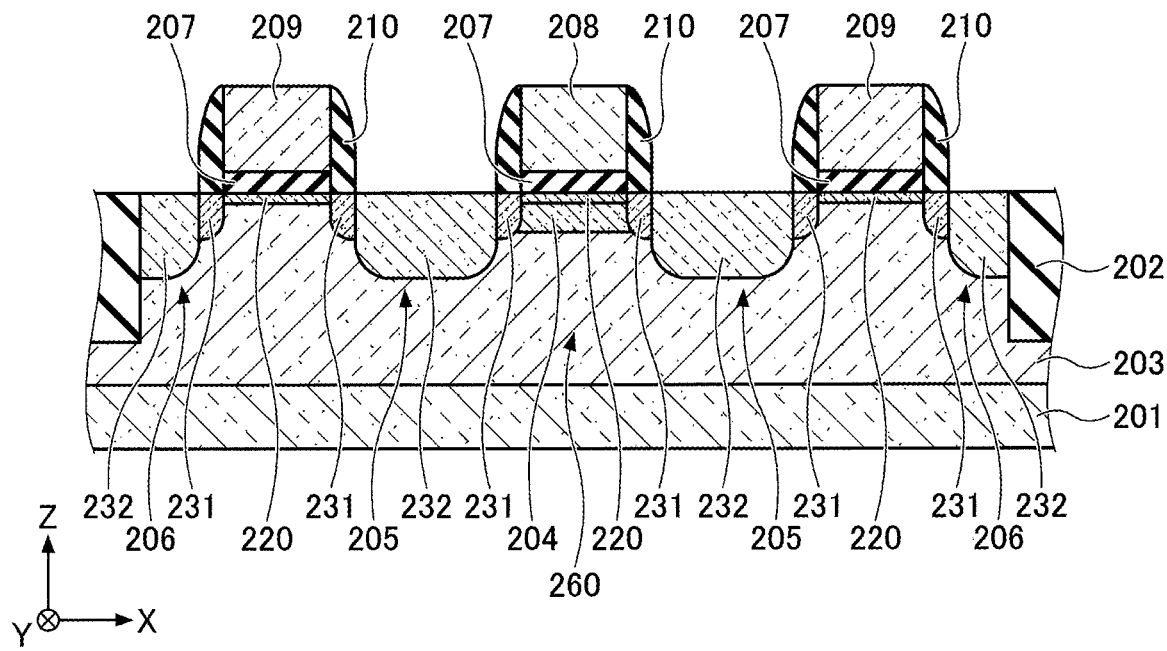
FIG. 12E is a cross sectional view (part 5) illustrating the manufacturing method for manufacturing the semiconductor device according to the fourth embodiment.

Thereafter, as illustrated in FIG. 12E, insulating film spacers 210 are formed on both sides of the gate electrode 208 and the dummy gate electrodes 209. Next, in the device active area 260, the n-type semiconductor area 232 having a second impurity concentration higher than the first impurity concentration is formed to be deeper than the n-type semiconductor area 231 by performing ion-implantation of an n-type impurity using the spacer 210, the gate electrode 208, and the dummy gate electrodes 209 as a mask. For example, phosphorus is ion-implanted as the n-type impurity at an energy of 5 keV to 30 keV and a dose of $1.0 \times 10^{15}$ cm$^{-2}$ to $3.0 \times 10^{16}$ cm$^{-2}$. In the top view, the n-type semiconductor areas 231 and 232 located between the gate electrode 208 and the dummy gate electrodes 209 constitute the n-type semiconductor area 205, and the n-type semiconductor areas 231 and 232 located on the opposite side of the dummy gate electrode 209 from the gate electrode 208 constitute the n-type semiconductor area 206.

Figure 12F:
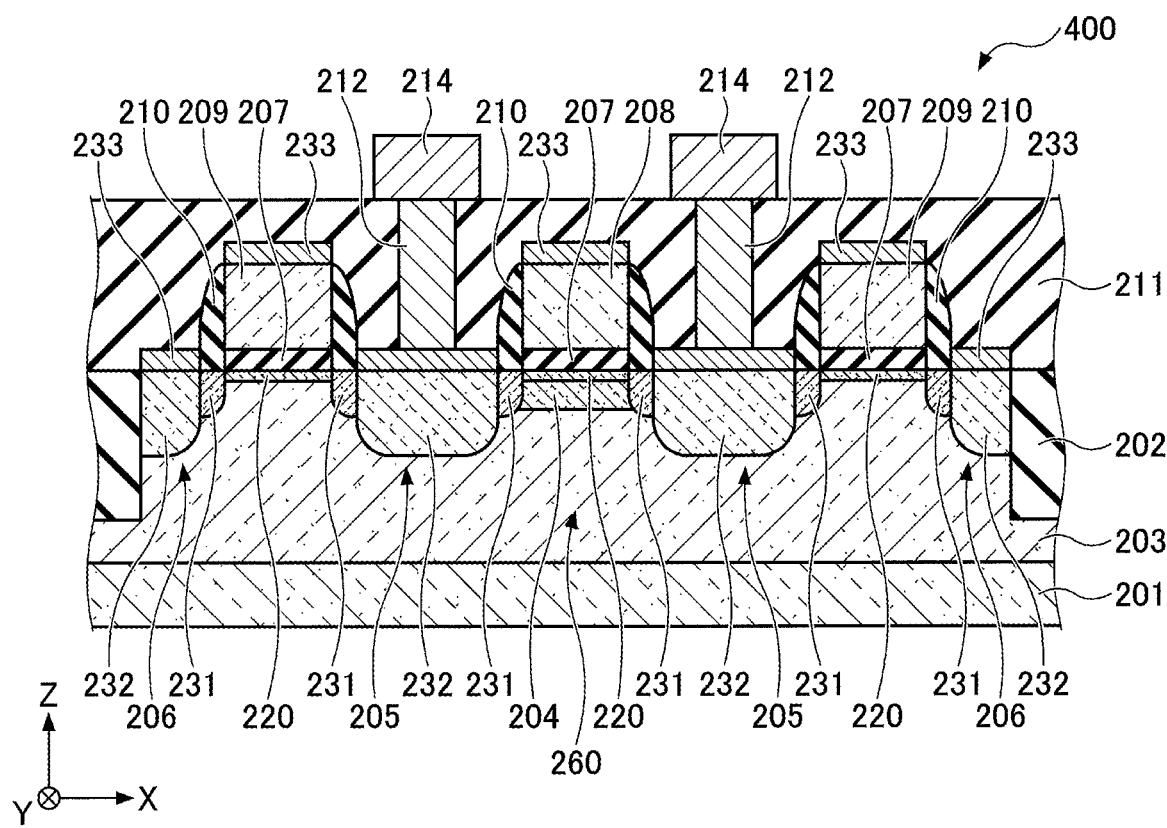
FIG. 12F is a cross sectional view (part 6) illustrating the manufacturing method for manufacturing the semiconductor device according to the fourth embodiment.

Next, as illustrated in FIG. 12F, the silicide layers 233 are formed on the n-type semiconductor area 232, the gate electrode 208, and the dummy gate electrode 209. Thereafter, the interlayer insulating film 211 is formed on the semiconductor substrate 201 and the silicon layer 220, and the surface thereof is smoothed by the CMP method or the like. Next, the contact holes reaching the silicide layer 233 on the n-type semiconductor area 205 and the contact hole reaching the silicide layer 233 on the gate electrode 208 are formed in the interlayer insulating film 211, and conductive films are formed in these contact holes. As a result, the conductive plugs 212 connected to the silicide layer 233 on the n-type semiconductor area 205 and the conductive plug 213 (see FIG. 11A) connected to the silicide layer 233 on the gate electrode 208 are formed. Next, the interconnects 214 connected to the conductive plugs 212 and the interconnect 215 connected to the conductive plug 213 are formed on the interlayer insulating film 211.

Then, if necessary, an interconnect or the like on an upper layer is formed to complete the semiconductor device 400.

In this manufacturing method, in the photolithography for forming the gate electrode 208 and the dummy gate electrodes 209, the photoresist is exposed and developed using a single exposure mask on which the pattern for the gate electrode 208 and the patterns for the dummy gate electrodes 209 are formed. Therefore, even when the gate electrode 208 of an actually-operated transistor is formed in an area where the pattern density is low, the pattern density is supplemented by the patterns for the dummy gate electrodes 209, which can increase the pattern density uniformity of the exposure mask. Therefore, the processing accuracy of the gate electrode 208 is less affected by the pattern density.

Figure 13:
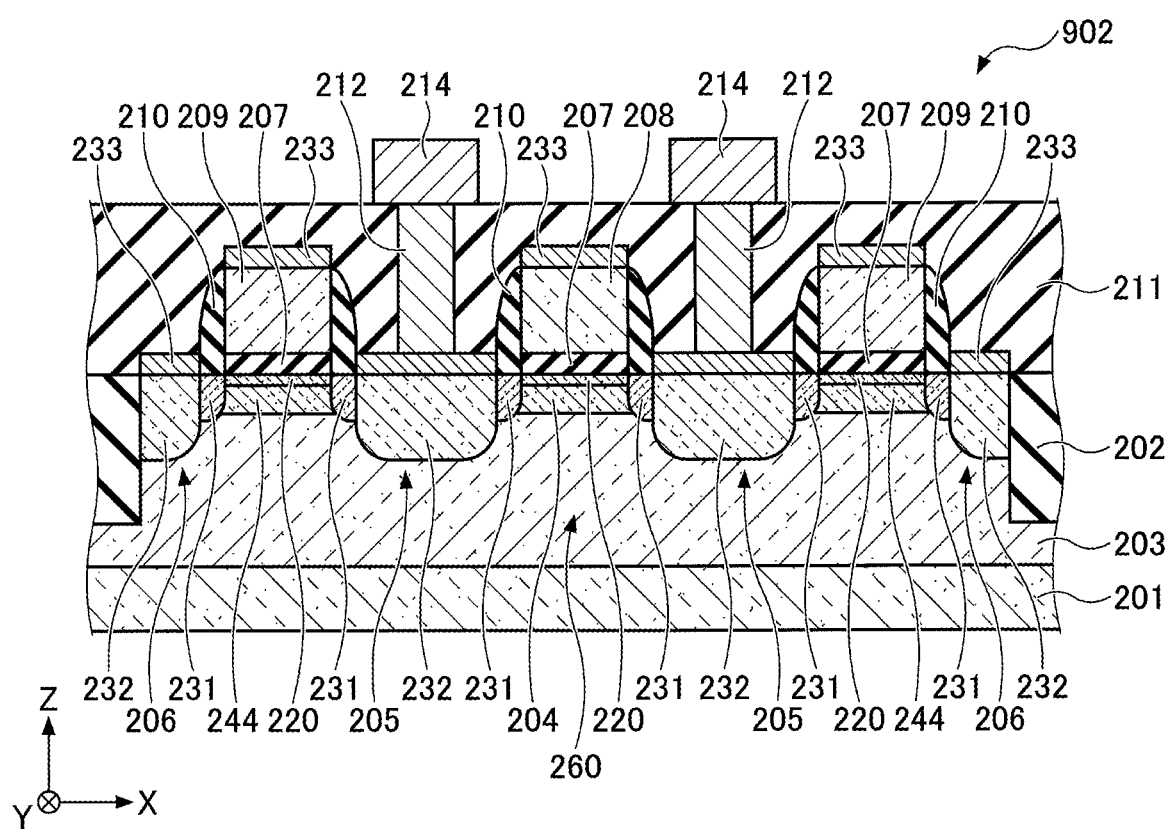
FIG. 13 is a cross sectional view illustrating a semiconductor device according to a second reference example.
Figure 14:
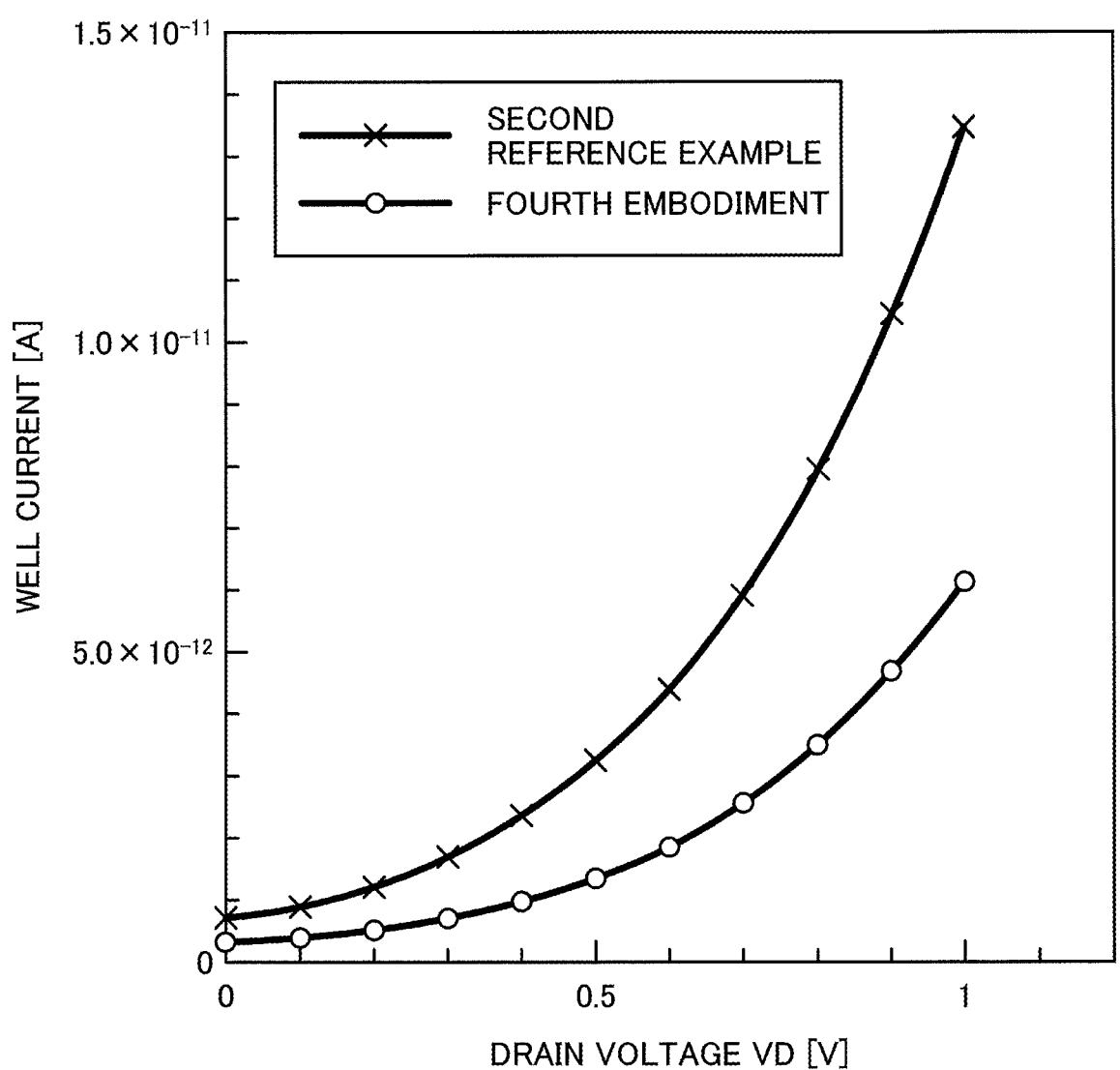
FIG. 14 is a drawing illustrating a result of simulation according to the fourth embodiment.

Here, the effect of the fourth embodiment will be described in comparison with a second reference example. FIG. 13 is a cross sectional view illustrating a semiconductor device according to the second reference example. FIG. 14 is a drawing illustrating a result of simulation according to the fourth embodiment.

As illustrated in FIG. 13, in a semiconductor device 902 according to the second reference example, p-type semiconductor areas 244 are formed in the surface layer portion of the p well 203 under the dummy gate electrodes 209. The p-type semiconductor areas 244 are formed at the same time as the p-type semiconductor area 204, and contain the same p-type impurity as the p-type semiconductor area 204 with the same concentration profile. Other configurations are similar to those of the fourth embodiment.

In this simulation, BF$_2$ is ion-implanted at an energy of 10 keV and a dose of $1.0 \times 10^{13}$ cm$^{-2}$ to form the p-type semiconductor areas 204 and 244. The gate length of the gate electrode 208 and the dummy gate electrodes 209 is assumed to be 60 nm, the gate width is assumed to be 1.0 µm, and the distance between the gate electrode 208 and the dummy gate electrode 209 in the X direction is 200 nm. Further, a gate voltage VG of 0 V is applied to the gate electrode 208, and a bias voltage VB of −0.5 V is applied to the p well 203 through the semiconductor substrate 201. The potentials of the dummy gate electrodes 209 and the n-type semiconductor area 206 are floating. A source voltage VS of 0 V is applied to one of the two interconnects 214, and a drain voltage VD of 0 V to 1.0 V is applied to the other of the two interconnects 214.

Then, a well current flowing between the p well 203 and the n-type semiconductor area 205 connected to the interconnect 214 to which the drain voltage VD is applied is calculated as a junction leakage current. FIG. 14 illustrates the calculation result. The horizontal axis of FIG. 14 represents the drain voltage VD, and the vertical axis represents the well current.

As illustrated in FIG. 14, according to the fourth embodiment, the well current can be significantly reduced from the second reference example. This is because the electric field of the pn junction under the dummy gate electrode 209 is suppressed, and the junction leakage current flowing through this pn junction is reduced.

Fifth Embodiment

Figure 15:
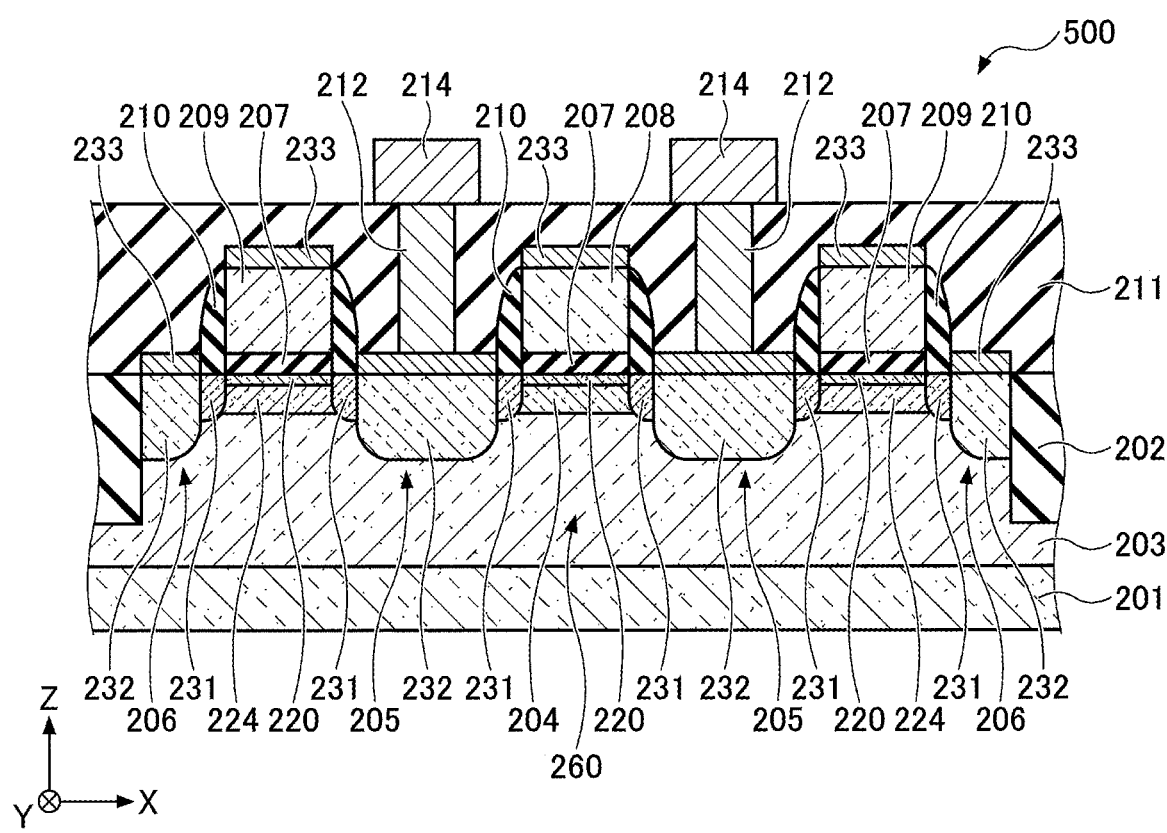
FIG. 15 is a cross sectional view illustrating a semiconductor device according to a fifth embodiment.

Next, the fifth embodiment will be described. FIG. 15 is a cross sectional view illustrating a semiconductor device according to the fifth embodiment. The positional relationship among a device isolation insulation film, source and drain semiconductor areas, electrodes, and interconnects in the fifth embodiment is the same as that of the fourth embodiment, and FIG. 15 is a cross sectional view taken along line I-I of FIG. 11A.

In a semiconductor device 500 according to the fifth embodiment, as illustrated in FIG. 15, the p-type semiconductor areas 224 are formed in the surface layer portion of the p well 203 under the dummy gate electrodes 209. The p-type semiconductor area 224 contains a p-type impurity at a lower concentration than that in the p-type semiconductor area 204. Other configurations are the same as those in the fourth embodiment.

In the semiconductor device 500 according to the fifth embodiment, the concentration of holes in the p-type semiconductor area 224 is lower than the concentration of holes in the p-type semiconductor area 204. Therefore, a depletion layer from the pn junction between the n-type semiconductor area 205 and the p-type semiconductor area 224 under the dummy gate electrode 209 extends more easily than a depletion layer from the pn junction between the n-type semiconductor area 205 and the p-type semiconductor area 204 under the gate electrode 208. Therefore, though the electric field of the pn junction under the dummy gate electrode 209 is affected by the electric field from the dummy gate electrode 209 that is given a potential by the potential distribution around the dummy gate electrode 109, the electric field of the pn junction under the dummy gate electrode 209 can be more suppressed than the electric field of the pn junction under the gate electrode 208, and the junction leakage current can be suppressed.

Next, a manufacturing method for manufacturing the semiconductor device 500 according to the fifth embodiment will be described. FIG. 16A to FIG. 16D are cross sectional views illustrating the manufacturing method for manufacturing the semiconductor device according to the fifth embodiment.

Figure 16A:
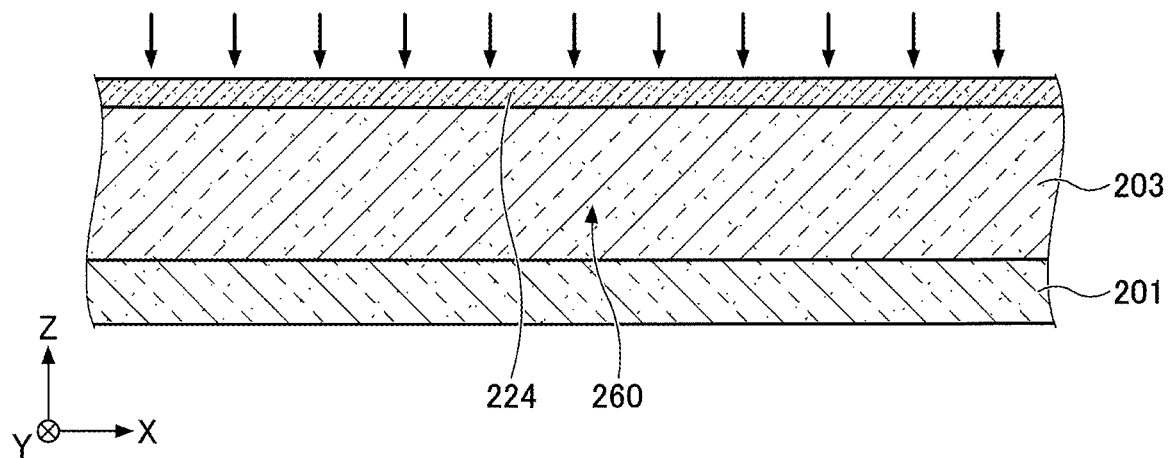
FIG. 16A is a cross sectional view (part 1) illustrating a manufacturing method for manufacturing the semiconductor device according to the fifth embodiment.

First, as illustrated in FIG. 16A, processing up to the formation of the p well 203 is performed in a manner similar to the fourth embodiment. Next, the p-type semiconductor area 224 is formed in the surface layer portion of the p well 203 by performing ion-implantation of a p-type impurity using the mask used for forming the p well 203. For example, boron is ion-implanted as the p-type impurity at an energy of 0.3 keV to 20 keV and a dose of less than $1.0 \times 10^{13}$ cm$^{-2}$. BF$_2$ may be ion-implanted as the p-type impurity at an energy of 3 keV to 30 keV and a dose of less than $1.0 \times 10^{13}$ cm$^{-2}$. The mask is removed after the ion implantation of the p-type impurity.

Figure 16B:
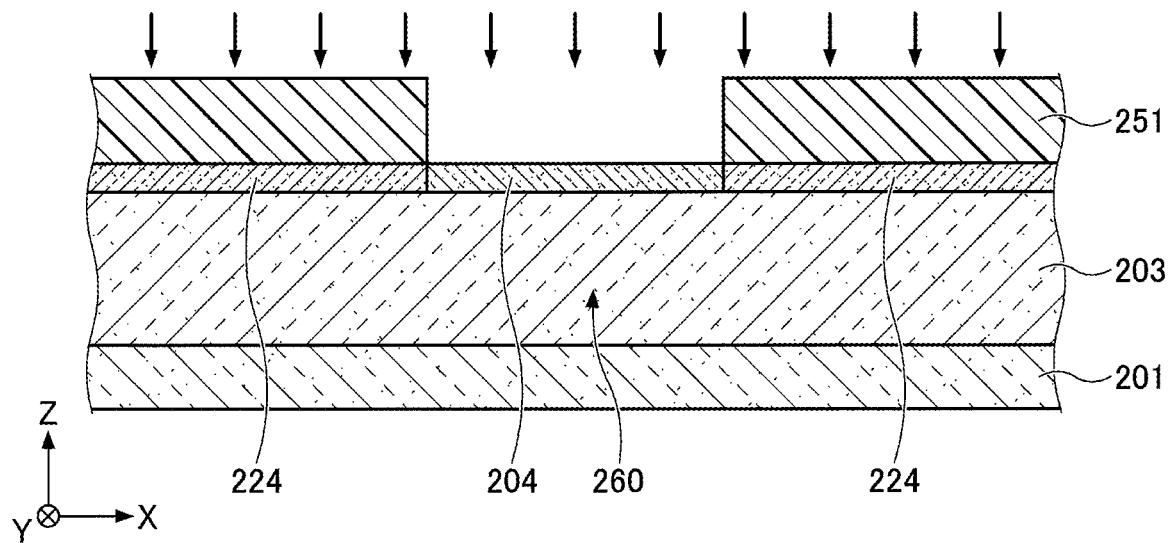
FIG. 16B is a cross sectional view (part 2) illustrating the manufacturing method for manufacturing the semiconductor device according to the fifth embodiment.

Thereafter, as illustrated in FIG. 16B, a mask 251 of photoresist having an opening for forming the p-type semiconductor area 204 is formed over the semiconductor substrate 201, and the p-type semiconductor area 204 is formed in the surface layer portion of the p well 203 by performing ion-implantation of a p-type impurity using the mask 251. For example, boron is ion-implanted as the p-type impurity at an energy of 0.3 keV to 20 keV and a dose of $1.0 \times 10^{12}$ cm$^{-2}$ to $1.0 \times 10^{14}$ cm$^{-2}$. BF$_2$ may be ion-implanted as the p-type impurity at an energy of 3 keV to 30 keV and a dose of $1.0 \times 10^{12}$ cm$^{-2}$ to $1.0 \times 10^{14}$ cm$^{-2}$. The p-type semiconductor area 204 includes the p-type impurity implanted by this ion implantation and the p-type impurity implanted when the p-type semiconductor area 224 is formed.

Figure 16C:
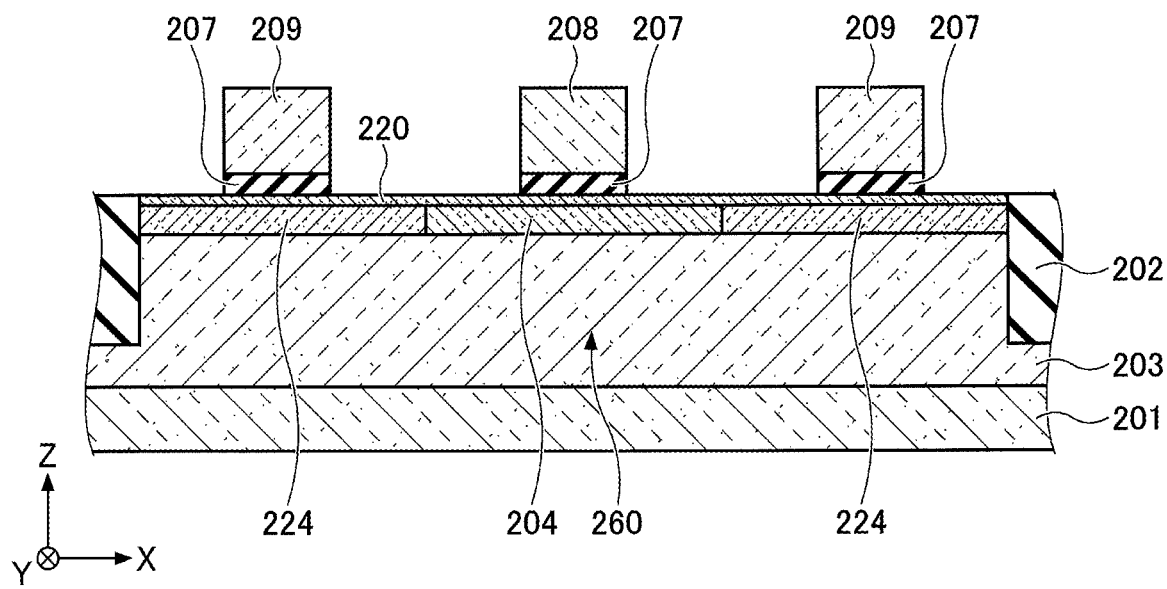
FIG. 16C is a cross sectional view (part 3) illustrating the manufacturing method for manufacturing the semiconductor device according to the fifth embodiment.

Thereafter, as illustrated in FIG. 16C, the mask 251 is removed, and the silicon layer 220 is formed over the semiconductor substrate 201. The silicon layer 220 can be formed by, for example, epitaxial growth. Next, the device isolation insulation film 202 that defines the device active area 260 is formed in the surface layer portion of the stack of the semiconductor substrate 201 and the silicon layer 220. The device isolation insulation film 202 can be formed by, for example, the STI method. Thereafter, the gate insulating film 207, the gate electrode 208, and the dummy gate electrodes 209 are formed. The gate electrode 208 is formed over the p-type semiconductor area 204, and the dummy gate electrodes 209 are formed over the p-type semiconductor area 224. In a manner similar to the fourth embodiment, in the photolithography for forming the gate electrode 208 and the dummy gate electrodes 209, the photoresist is exposed and developed using a single exposure mask on which the pattern for the gate electrode 208 and the patterns for the dummy gate electrodes 209 are formed.

Figure 16D:
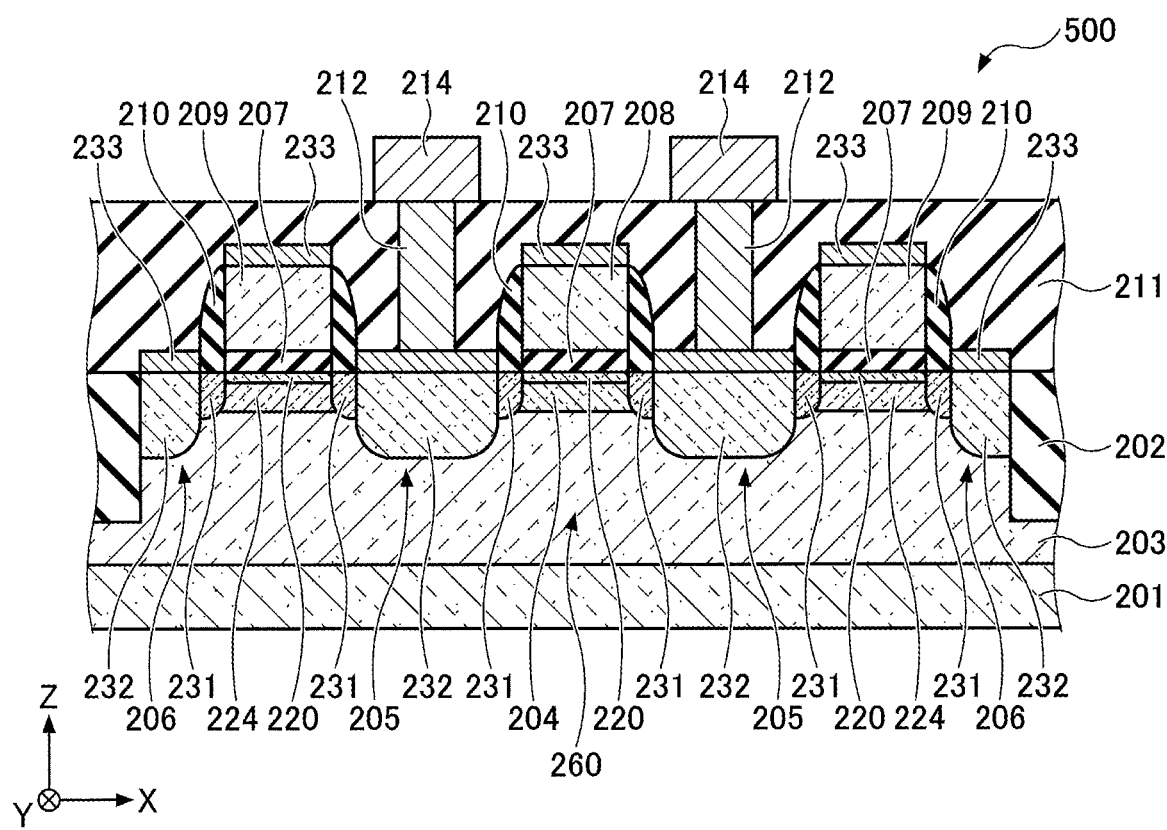
FIG. 16D is a cross sectional view (part 4) illustrating the manufacturing method for manufacturing the semiconductor device according to the fifth embodiment.

Next, as illustrated in FIG. 16D, the semiconductor device 500 is completed by performing the processing of the formation of the n-type semiconductor areas 231 and subsequent processing in a manner similar to the fourth embodiment.

According to this manufacturing method, in a manner similar to the fourth embodiment, the processing accuracy of the gate electrode 208 is less affected by the pattern density.

Figure 17:
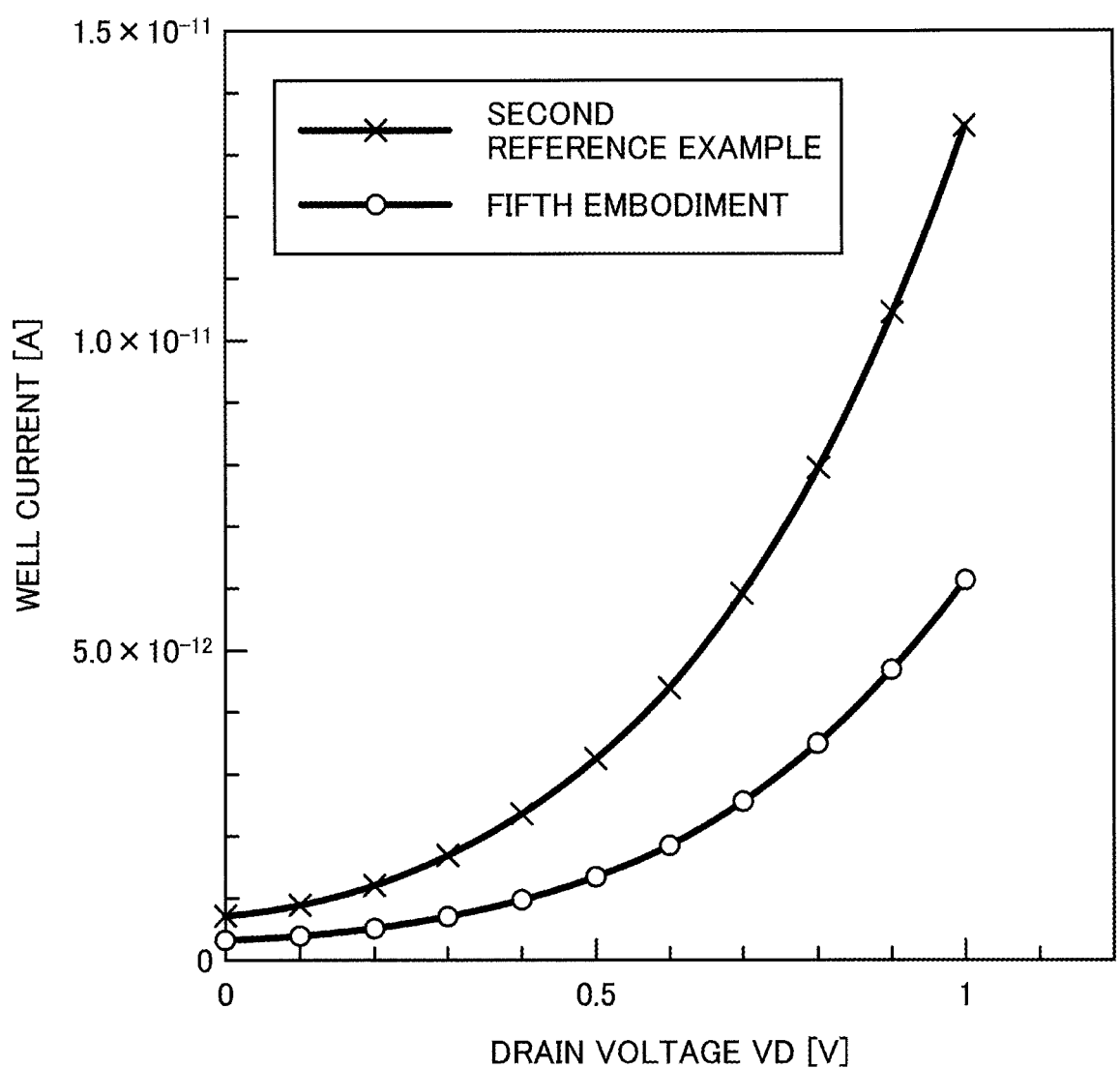
FIG. 17 is a drawing illustrating a result of simulation according to the fifth embodiment.

Here, the effect of the fifth embodiment will be described in comparison with the second reference example. FIG. 17 is a drawing illustrating a result of simulation according to the fifth embodiment.

In this simulation, the p-type semiconductor area 204 is formed by performing ion implantation of BF$_2$ at an energy of 10 keV and a dose of $1.0 \times 10^{13}$ cm$^{-2}$. Also, the p-type semiconductor area 224 is formed by performing ion implantation of BF$_2$ at an energy of 10 keV and a dose of $2.0 \times 10^{12}$ cm$^{-2}$. Other conditions are the same as in the fourth embodiment.

Then, a well current flowing between the p well 203 and the n-type semiconductor area 205 connected to the interconnect 214 to which the drain voltage VD is applied is calculated as a junction leakage current. FIG. 17 illustrates the calculation result. The horizontal axis of FIG. 17 represents the drain voltage VD, and the vertical axis represents the well current.

As illustrated in FIG. 17, according to the fifth embodiment, the well current can also be significantly reduced from the second reference example. This is because the electric field of the pn junction under the dummy gate electrode 209 is suppressed, and the junction leakage current flowing through this pn junction is reduced.

Sixth Embodiment

Figure 18:
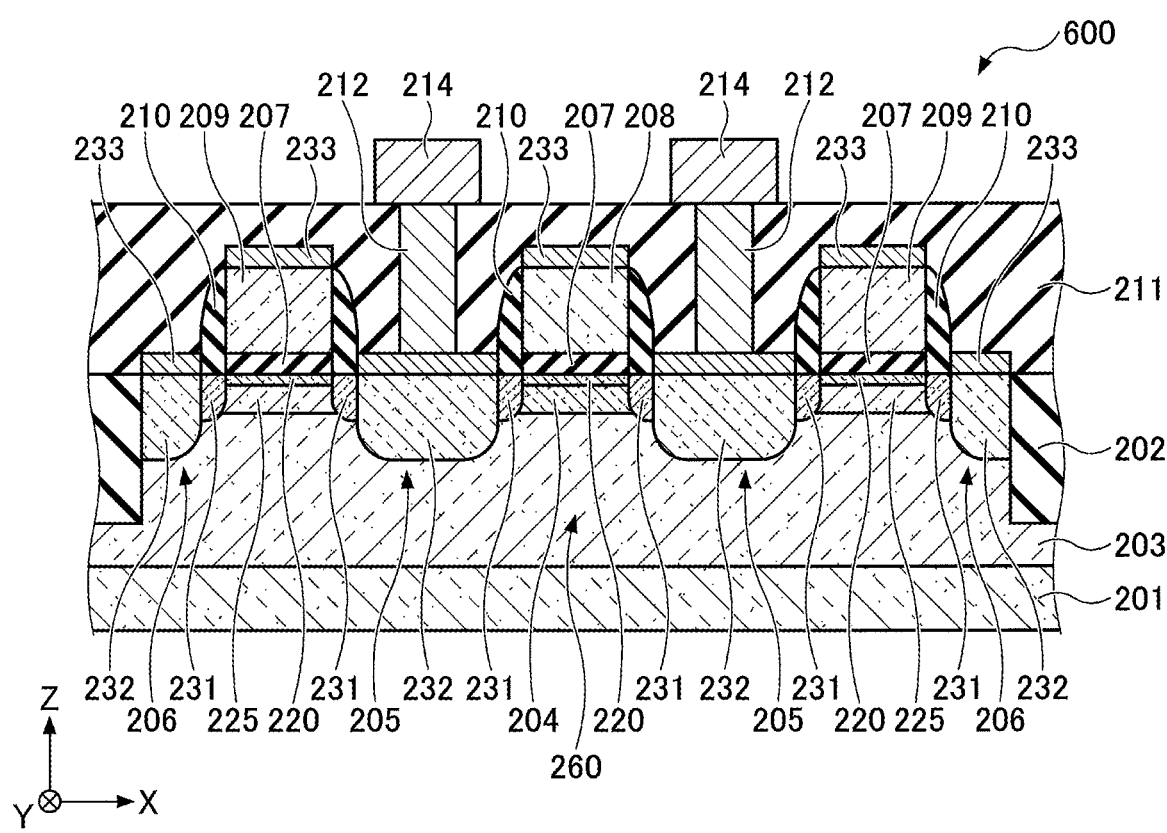
FIG. 18 is a cross sectional view illustrating a semiconductor device according to a sixth embodiment.

Next, the sixth embodiment will be described. FIG. 18 is a cross sectional view illustrating a semiconductor device according to the sixth embodiment. The positional relationship among a device isolation insulation film, source and drain semiconductor areas, electrodes, and interconnects in the sixth embodiment is the same as that of the fourth embodiment, and FIG. 18 is a cross sectional view taken along line I-I of FIG. 11A.

In a semiconductor device 600 according to the sixth embodiment, as illustrated in FIG. 18, n-type semiconductor areas 225 are formed in the surface layer portion of the p well 203 under the dummy gate electrodes 209. For example, the n-type semiconductor areas 225 contain phosphorus as the n-type impurity. Other configurations are the same as those in the fourth embodiment. The n-type semiconductor area 225 is an example of a fourth semiconductor area.

In the semiconductor device 600 according to the sixth embodiment, there is no pn junction between the n-type semiconductor area 225 and the n-type semiconductor area 205. The n-type semiconductor area 225 includes holes as minority carriers, but the concentration of holes in the n-type semiconductor area 225 is lower than the concentration of holes in the p-type semiconductor area 204. Furthermore, the concentration of holes in the p well 203 under the dummy gate electrode 209 and alongside the n-type semiconductor area 205 is lower than the concentration of holes in the p-type semiconductor area 204. Therefore, though the electric field of the pn junction under the dummy gate electrode 209 is affected by the electric field from the dummy gate electrode 209 that is given a potential by the potential distribution around the dummy gate electrode 109, the electric field of the pn junction under the dummy gate electrode 209 can be more suppressed than the electric field of the pn junction under the gate electrode 208, and the junction leakage current can be suppressed.

Next, a manufacturing method for manufacturing the semiconductor device 600 according to the sixth embodiment will be described. FIG. 19A to FIG. 19D are cross sectional views illustrating the manufacturing method for manufacturing the semiconductor device according to the sixth embodiment.

Figure 19A:
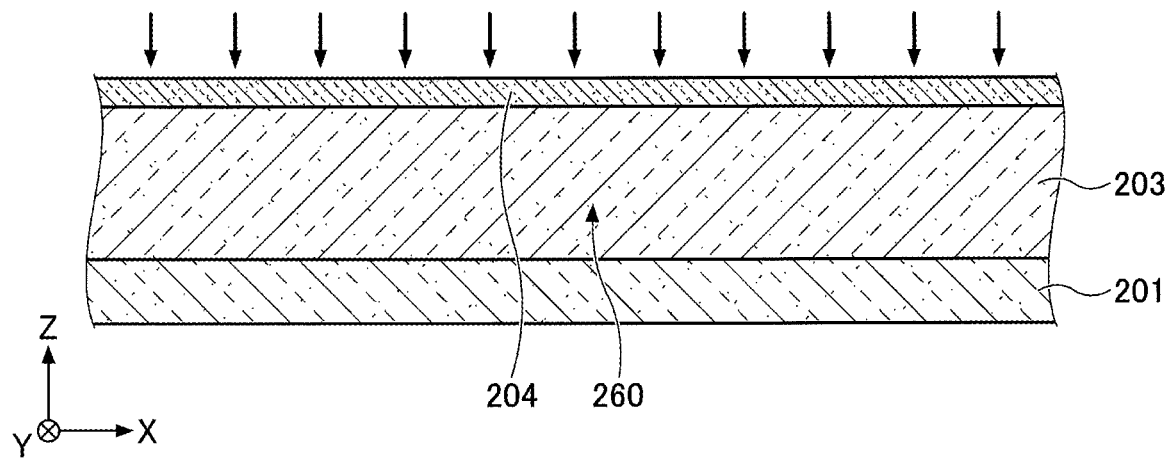
FIG. 19A is a cross sectional view (part 1) illustrating a manufacturing method for manufacturing the semiconductor device according to the sixth embodiment.

First, as illustrated in FIG. 19A, processing up to the formation of the p well 203 is performed in a manner similar to the fourth embodiment. Next, the p-type semiconductor area 204 is formed in the surface layer portion of the p well 203 by performing ion-implantation of a p-type impurity using the mask used for forming the p well 203. For example, boron is ion-implanted as the p-type impurity at an energy of 0.3 keV to 20 keV and a dose of less than $1.0\times10^{12}$ $cm^{-2}$ to $1.0\times10^{14}$ $cm^{-2}$. $BF_2$ may be ion-implanted as the p-type impurity at an energy of 3 keV to 30 keV and a dose of $1.0\times10^{12}$ $cm^{-2}$ to $1.0\times10^{14}$ $cm^{-2}$. The mask is removed after the ion implantation of the p-type impurity.

Figure 19B:
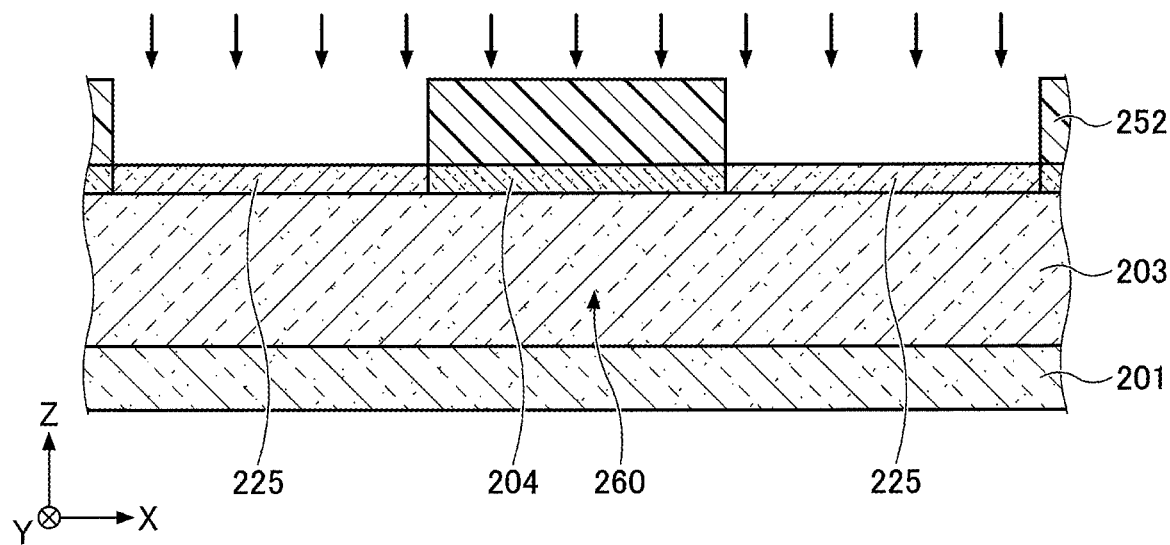
FIG. 19B is a cross sectional view (part 2) illustrating the manufacturing method for manufacturing the semiconductor device according to the sixth embodiment.

Thereafter, as illustrated in FIG. 19B, a mask 252 of photoresist having openings for forming the n-type semiconductor areas 225 is formed over the semiconductor substrate 201, and the n-type semiconductor areas 225 are formed in the surface layer portion of the p well 203 by performing ion-implantation of an n-type impurity using the mask 252. For example, phosphorus is ion-implanted as the n-type impurity at an energy of 5 keV to 30 keV and a dose of $1.0\times10^{12}$ $cm^{-2}$ to $1.0\times10^{14}$ $cm^{-2}$. The n-type semiconductor area 225 also contains a p-type impurity, but since the electron concentration exceeds the hole concentration, the conductive type is reversed from the p-type to the n-type. When a p-channel type transistor is formed on the semiconductor substrate 201, the n-type semiconductor areas 225 may be formed simultaneously with ion implantation for adjusting the threshold voltage of the p-channel type transistor.

Figure 19C:
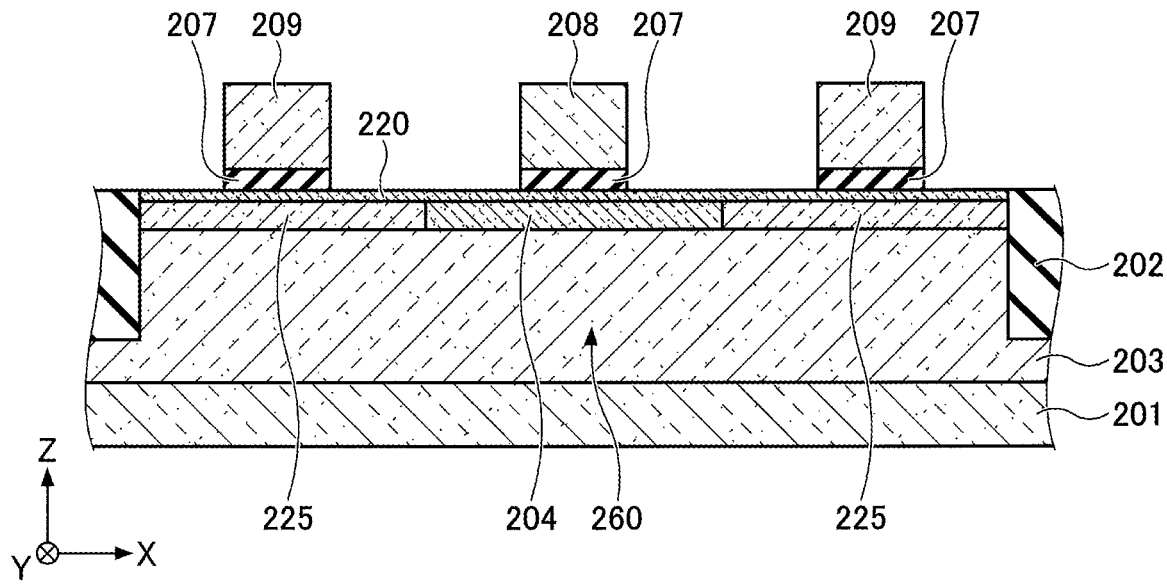
FIG. 19C is a cross sectional view (part 3) illustrating the manufacturing method for manufacturing the semiconductor device according to the sixth embodiment.

Next, as illustrated in FIG. 19C, the mask 252 is removed, and the silicon layer 220 is formed on the semiconductor substrate 201. The silicon layer 220 can be formed by, for example, epitaxial growth. Next, the device isolation insulation film 202 that defines the device active area 260 is formed in the surface layer portion of the stack of the semiconductor substrate 201 and the silicon layer 220. The device isolation insulation film 202 can be formed by, for example, the STI method. Thereafter, the gate insulating film 207, the gate electrode 208, and the dummy gate electrodes 209 are formed. The gate electrode 208 is formed over the p-type semiconductor area 204, and the dummy gate electrodes 209 are formed over the n-type semiconductor area 225. In a manner similar to the fourth embodiment, in the photolithography for forming the gate electrode 208 and the dummy gate electrodes 209, the photoresist is exposed and developed using a single exposure mask on which the pattern for the gate electrode 208 and the patterns for the dummy gate electrodes 209 are formed.

Figure 19D:
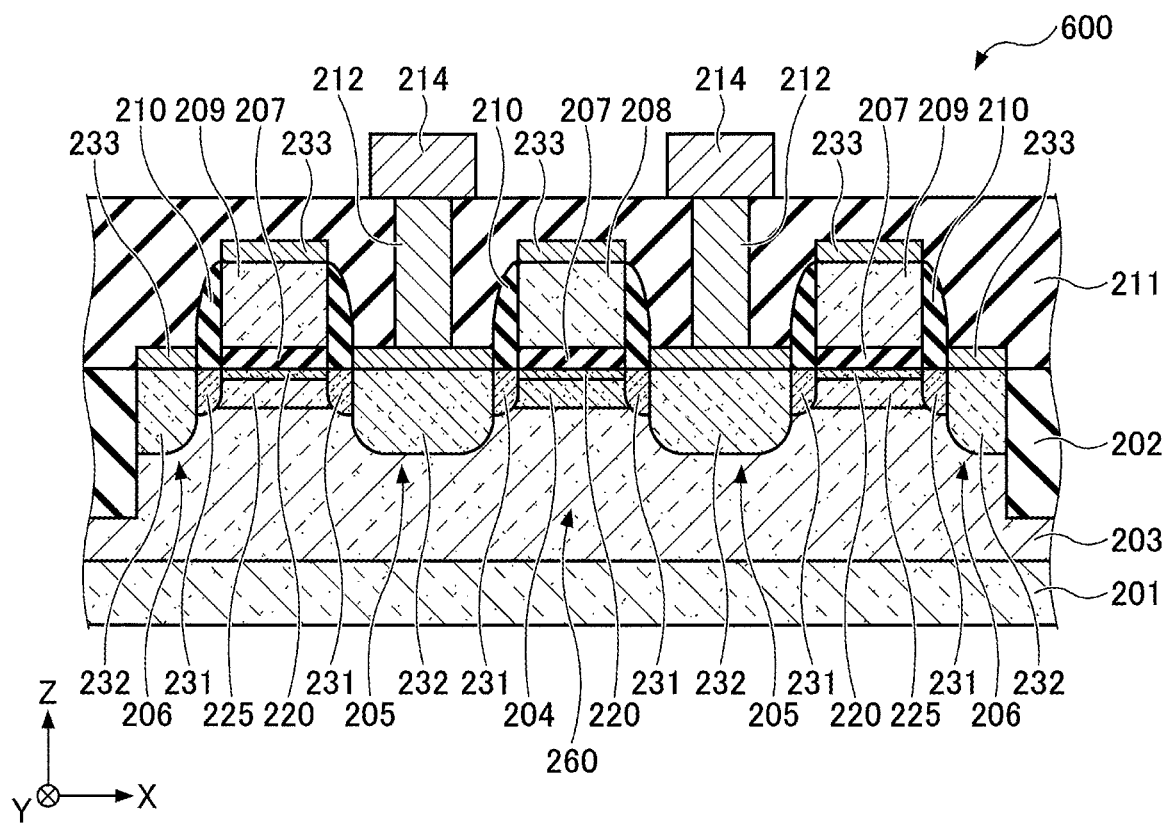
FIG. 19D is a cross sectional view (part 4) illustrating the manufacturing method for manufacturing the semiconductor device according to the sixth embodiment.

Next, as illustrated in FIG. 19D, the semiconductor device 600 is completed by performing the processing of the formation of the n-type semiconductor areas 231 and subsequent processing in a manner similar to the fourth embodiment.

According to this manufacturing method, in a manner similar to the fourth embodiment, the processing accuracy of the gate electrode 208 is less affected by the pattern density.

Figure 20:
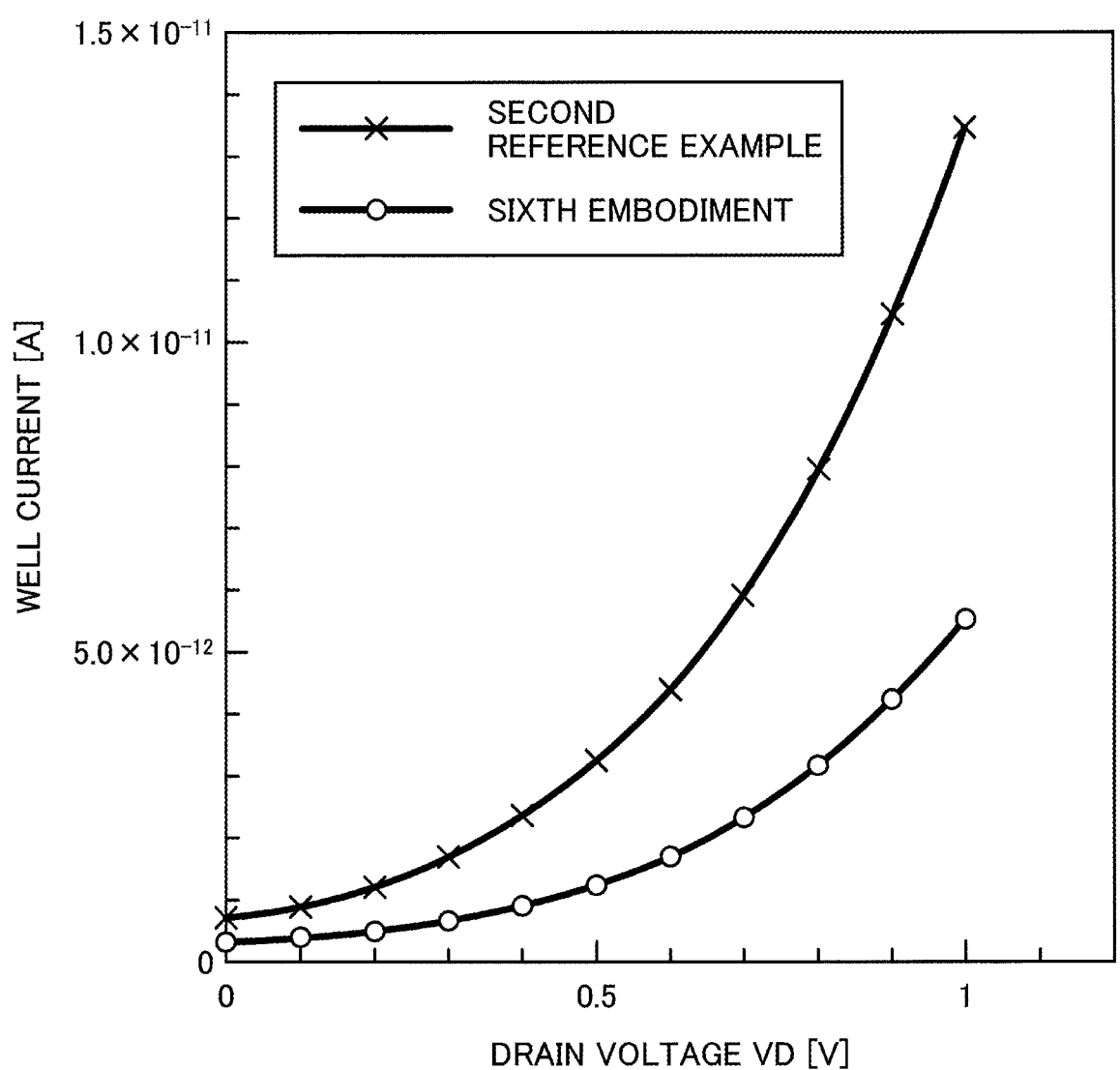
FIG. 20 is a drawing illustrating a result of simulation according to the sixth embodiment.

Here, the effect of the sixth embodiment will be described in comparison with the second reference example. FIG. 20 is a drawing illustrating a result of simulation according to the sixth embodiment.

In this simulation, the p-type semiconductor area 204 is formed by performing ion implantation of $BF_2$ at an energy of 10 keV and a dose of $1.0\times10^{13}$ $cm^{-2}$. Also, the n-type semiconductor area 225 is formed by performing ion implantation of phosphorus at an energy of 15 keV and a dose of $1.1\times10^{13}$ $cm^{-2}$. Other conditions are the same as in the fourth embodiment.

Then, a well current flowing between the p well 203 and the n-type semiconductor area 205 connected to the interconnect 214 to which the drain voltage VD is applied is calculated as a junction leakage current. FIG. 20 illustrates the calculation result. The horizontal axis of FIG. 20 represents the drain voltage VD, and the vertical axis represents the well current.

As illustrated in FIG. 20, according to the sixth embodiment, the well current can also be significantly reduced from the second reference example. This is because, under the dummy gate electrode 209, there is no pn junction that is affected easily by the electric field from the dummy gate electrode 209, and the junction leakage current in proximity to the dummy gate electrode 209 is reduced.

Seventh Embodiment

Figure 21A:
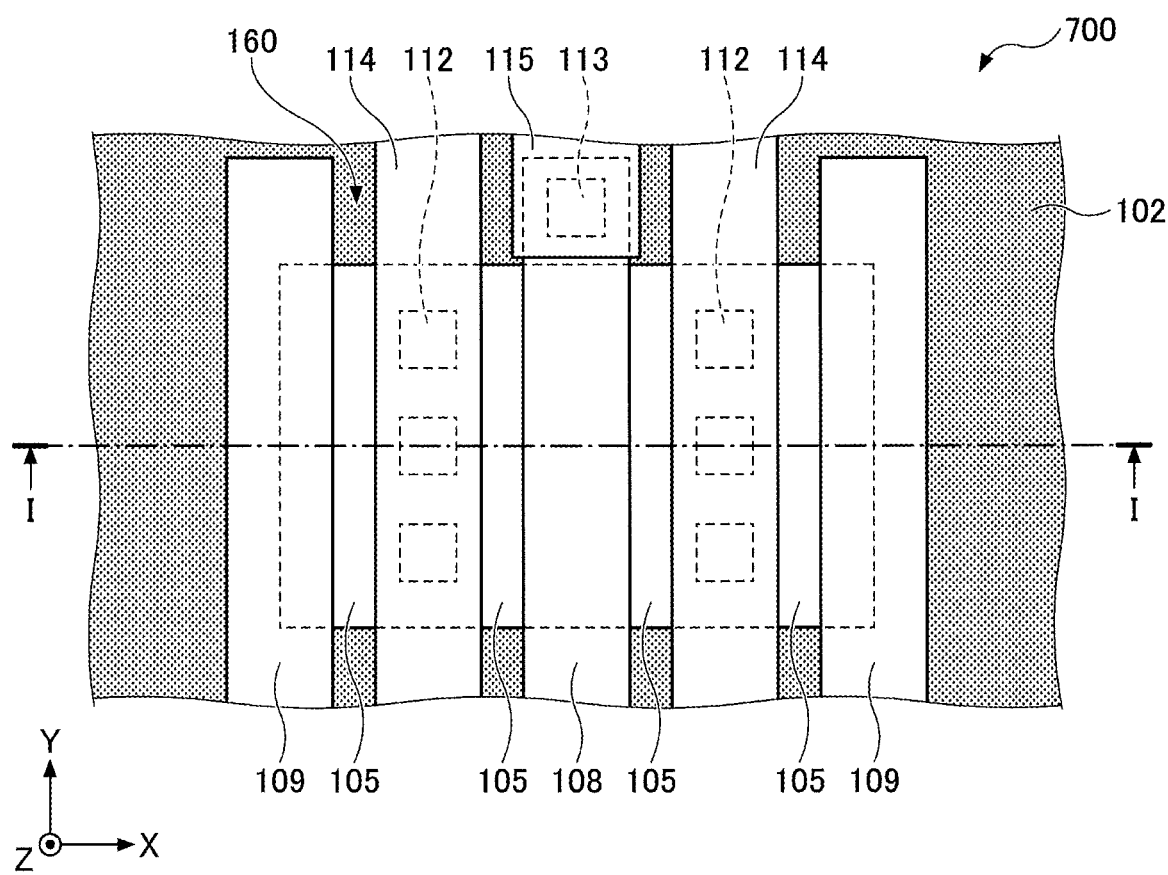
FIG. 21A is a top view illustrating a semiconductor device according to a seventh embodiment.
Figure 21B:
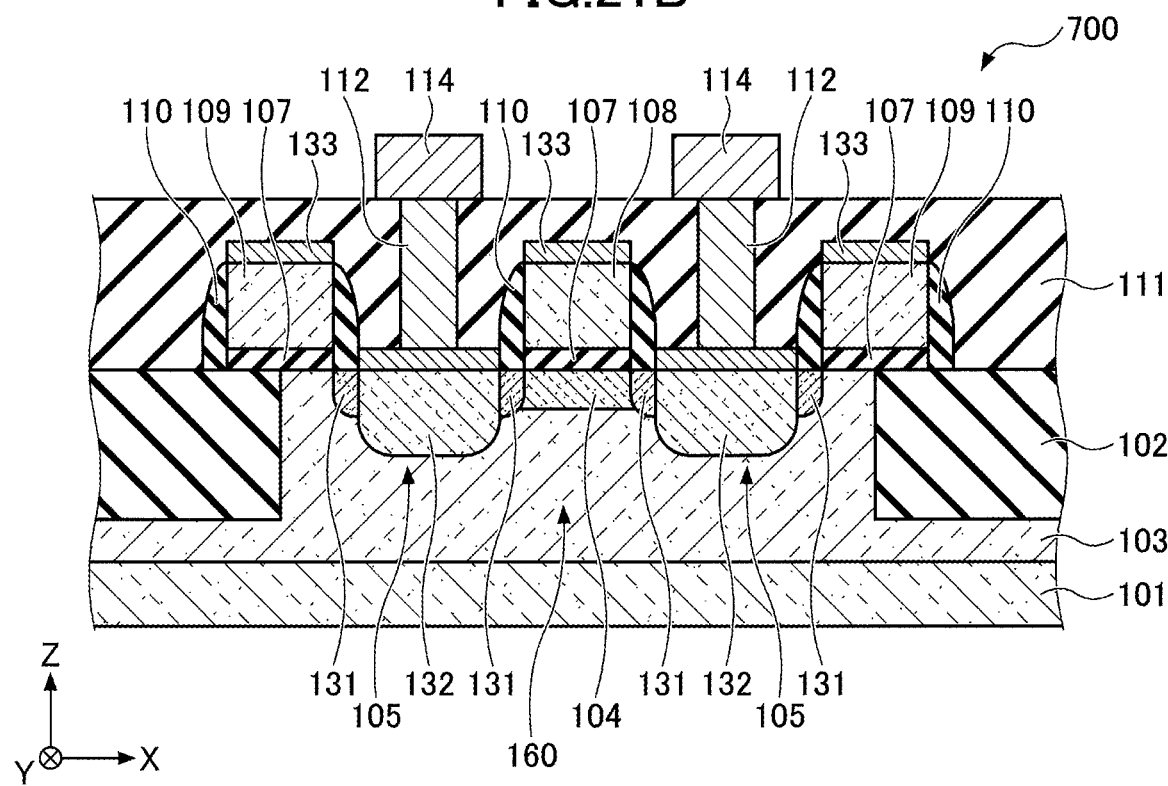
FIG. 21B is a cross sectional view illustrating a semiconductor device according to the seventh embodiment.

Next, the seventh embodiment will be explained. FIG. 21A is a top view illustrating a semiconductor device according to the seventh embodiment. FIG. 21B is a cross sectional view illustrating the semiconductor device according to the seventh embodiment. FIG. 21A mainly illustrates a positional relationship among a device isolation insulation film, source and drain semiconductor areas, electrodes, and interconnects. FIG. 21B corresponds to a cross sectional view taken along line I-I of FIG. 21A.

As illustrated in FIG. 21A and FIG. 21B, in the semiconductor device 700 according to the seventh embodiment, a device isolation insulation film 102 is formed so as to extend to under the dummy gate electrode 109 in the X direction. From another perspective, an edge of the dummy gate electrode 109 in the X direction is located over the device isolation insulation film 102. The semiconductor device 700 does not include the n-type semiconductor area 106 that is included in the semiconductor device 100 according to the first embodiment. Other configurations are similar to those of the first embodiment.

In the semiconductor device 700 according to the seventh embodiment, the concentration of holes in the p well 103 under the dummy gate electrode 109 and alongside the n-type semiconductor area 105 is lower than the concentration of holes in the p-type semiconductor area 104. Therefore, a depletion layer from the pn junction between the n-type semiconductor area 105 and the p well 103 under the dummy gate electrode 109 extends more easily than a depletion layer from the pn junction between the n-type semiconductor area 105 and the p-type semiconductor area 104 under the gate electrode 108. Therefore, though the electric field of the pn junction under the dummy gate electrode 109 is affected by the electric field from the dummy gate electrode 109 that is given a potential by the potential distribution around the dummy gate electrode 109, the electric field of the pn junction under the dummy gate electrode 109 can be more suppressed than the electric field of the pn junction under the gate electrode 108, and the junction leakage current can be suppressed.

In the first embodiment, there is a risk that, depending on the impurity concentration of the p well 103 between the n-type semiconductor area 105 and the n-type semiconductor area 106, the n-type semiconductor area 105 and the n-type semiconductor area 106 may be electrically connected, which increases the capacitance of the n-type semiconductor area 105. The increase in the capacitance of the n-type semiconductor area 105 may lead to deterioration of device characteristics. On the other hand, since the n-type semiconductor area 106 is not provided in the seventh embodiment, such an increase in the capacitance of the n-type semiconductor area 105 can be prevented.

Figure 22:
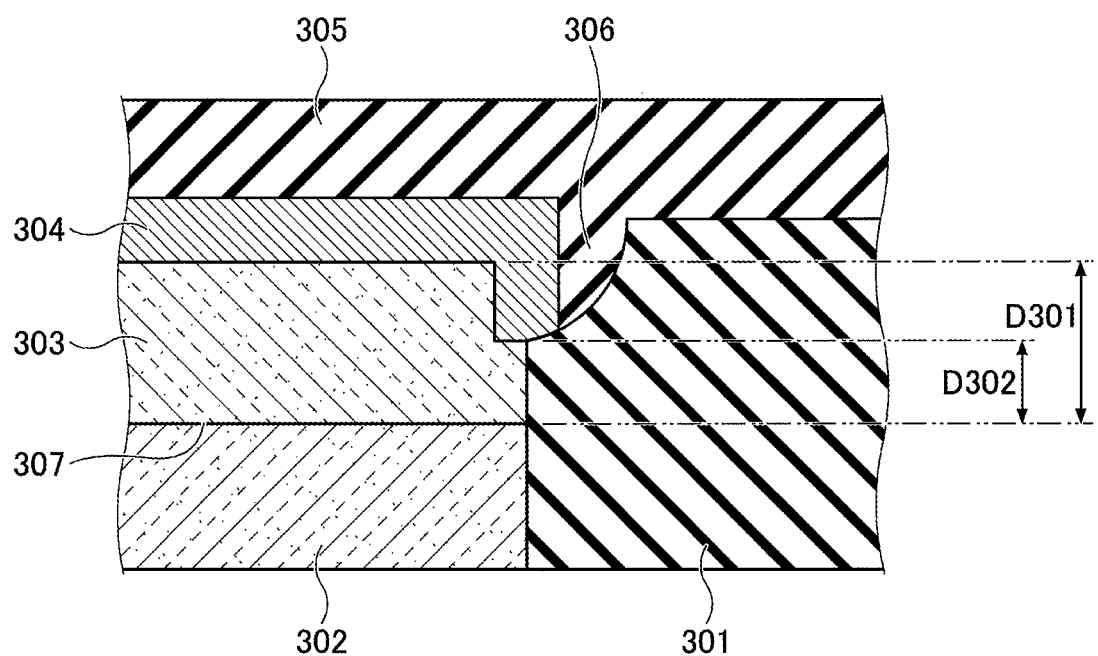
FIG. 22 is a diagram illustrating a divot of a device isolation insulation film.

Furthermore, the seventh embodiment is effective in suppressing the leakage current caused by a divot formed in the device isolation insulation film 102. FIG. 22 is a diagram illustrating a divot of a device isolation insulation film.

In the example illustrated in FIG. 22, in the device active area defined by a device isolation insulation film 301, an n-type semiconductor area 303 is formed in the surface layer portion of a p well 302, and a silicide layer 304 is formed on the surface of the n-type semiconductor area 303. An interlayer insulating film 305 is formed so as to cover the device isolation insulation film 301 and the silicide layer 304. A pn junction 307 is formed between the p well 302 and the n-type semiconductor area 303. The device isolation insulation film 301 is formed by the STI method. In the vicinity of the boundary between the device isolation insulation film 301 and the n-type semiconductor area 303, a divot 306 is formed in a groove shape on the surface of the boundary. The device isolation insulation film 301 corresponds to the device isolation insulation film 102. The p well 302 corresponds to p well 103. The n-type semiconductor area 303 corresponds to the n-type semiconductor area 106. The silicide layer 304 corresponds to the silicide layer 133. The interlayer insulating film 305 corresponds to interlayer insulating film 111.

Since a leakage current is generated between the silicide layer 304 and the pn junction 307, the distance between the silicide layer 304 and the pn junction 307 is preferably long. On the other hand, the divot 306 is inevitably formed. As illustrated in FIG. 22, the silicide layer 304 is formed so as to extend into the divot 306. Therefore, a distance D302 between a portion of the silicide layer 304 extending into the divot 306 and the pn junction 307 is shorter than a distance D301 between a portion of the silicide layer 304 on the upper surface of the n-type semiconductor area 303 and the pn junction 307. The depth of the divot 306 varies due to fluctuations in the manufacturing process, and is difficult to be controlled.

On the other hand, in the seventh embodiment, even if a divot is formed on the surface of the device isolation insulation film 102 under the dummy gate electrode 109, a silicide layer extending into the divot is not formed under the dummy gate electrode 109. Therefore, according to the seventh embodiment, the leakage current caused by the silicide layer extending into the divot can be suppressed.

A structure similar to that of the device isolation insulation film 102 in the seventh embodiment may be applied to the second and third embodiments. Applying the seventh embodiment to the third embodiment is particularly effective because the n-type semiconductor area 105 and the n-type semiconductor area 106 are electrically connected via the n-type semiconductor area 125. Further, the structure of the device isolation insulation film 102 in the fourth, fifth, and sixth embodiments may be configured in a similar manner to the structure of the device isolation insulation film 102 in the seventh embodiment. Applying the seventh embodiment to the sixth embodiment is particularly effective because the n-type semiconductor area 205 and the n-type semiconductor area 206 are electrically connected via the n-type semiconductor area 225.

Eighth Embodiment

Figure 23A:
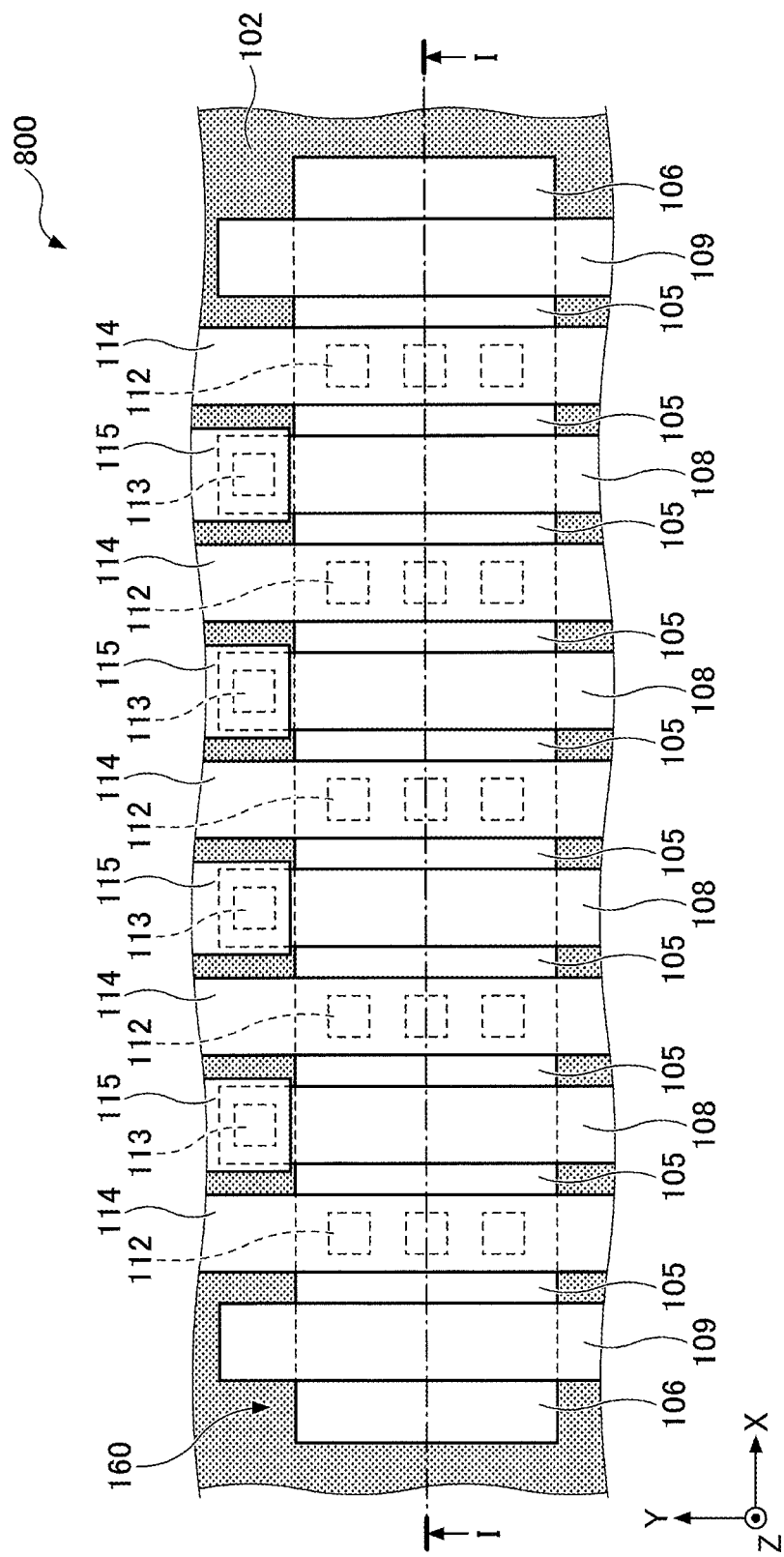
FIG. 23A is a top view illustrating a semiconductor device according to an eighth embodiment.

Next, the eighth embodiment will be explained. FIG. 23A is a top view illustrating a semiconductor device according to the eighth embodiment. FIG. 23B is a cross sectional view illustrating the semiconductor device according to the eighth embodiment. FIG. 23A mainly illustrates a positional relationship among a device isolation insulation film, source and drain semiconductor areas, electrodes, and interconnects. FIG. 23B corresponds to a cross sectional view taken along line I-I of FIG. 23A.

In the first embodiment, one gate electrode 108 is provided between two dummy gate electrodes 109. On the other hand, in the semiconductor device 800 according to the eighth embodiment, as illustrated in FIG. 23A and FIG. 23B, a plurality of, for example, four gate electrodes 108 are provided between two dummy gate electrodes 109. The distance between any adjacent two of the four gate electrodes 108 is constant. The four gate electrodes 108 have the same gate length. An n-type semiconductor area 105 is formed between adjacent gate electrodes 108. Other configurations are similar to those of the first embodiment.

Also in the eighth embodiment, even if the electric field of the pn junction under the dummy gate electrode 109 receives the electric field from the dummy gate electrode 109, the electric field of the pn junction under the dummy gate electrode 109 can be more suppressed than the electric field of the pn junction under the gate electrode 108, and the junction leakage current can be suppressed.

In a manufacturing method for manufacturing the semiconductor device 800, in the photolithography for forming the gate electrodes 108 and the dummy gate electrodes 109, the photoresist is exposed and developed using a single exposure mask on which the patterns for the gate electrodes 108 and the patterns for the dummy gate electrodes 109 are formed. According to this manufacturing method, the four gate electrodes 108 are highly uniform in the gate length. This is because the pattern densities around the gate electrodes 108 on the exposure mask are highly uniform.

A structure in which a plurality of gate electrodes 108 are provided between two dummy gate electrodes 109 may be applied to the second, third, and seventh embodiments. A structure in which a plurality of gate electrodes 208 are provided between two dummy gate electrodes 209 may be applied to the fourth, fifth, and sixth embodiments.

According to the present disclosure, the processing accuracy of the gate electrode is less affected by the pattern density while an increase in the leakage current is suppressed.

In the present disclosure, the impurity is not particularly limited. For example, arsenic (As) or antimony (Sb) may be used as an n-type impurity, and indium (In) or aluminum (Al) may be used as a p-type impurity. Further, the conductive type of a transistor to which the present disclosure can be applied is not particularly limited, and the present disclosure may be applied to a p-channel type transistor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:

1. A semiconductor device comprising:
    a semiconductor substrate;
    a first semiconductor area of a first conductive type disposed in a surface layer portion of the semiconductor substrate;
    a gate electrode disposed over the first semiconductor area, extending in a first direction, and being a conductive material;
    a dummy gate electrode disposed over the semiconductor substrate away from the gate electrode, extending in the first direction, and being the conductive material;
    a second semiconductor area of a second conductive type disposed, in the surface layer portion of the semiconductor substrate, between the gate electrode and the dummy gate electrode; and
    an interconnect connected to the second semiconductor area,
    wherein a concentration of carrier of a first carrier type in the semiconductor substrate under the dummy gate electrode and alongside the second semiconductor area is lower than a concentration of majority carrier in the first semiconductor area, the first carrier type is a same carrier type as the majority carrier, and
    a portion of the lower concentration of carrier of the first carrier type in the semiconductor substrate under the dummy gate electrode is disposed in contact with the second semiconductor area.

2. The semiconductor device according to claim 1, wherein the dummy gate electrode is disposed alongside the gate electrode and extending at least an entirety of a portion of the gate electrode over the first semiconductor area.

3. The semiconductor device according to claim 1, wherein a distance between the gate electrode and the dummy gate electrode is constant throughout an entirety of a portion of the gate electrode over the first semiconductor area.

4. The semiconductor device according to claim 1, further comprising:
    a third semiconductor area of the second conductive type disposed, in the semiconductor substrate, at a side opposite to the gate electrode with respect to the dummy gate electrode,
    wherein a potential of the third semiconductor area is floating.

5. The semiconductor device according to claim 1, further comprising a fourth semiconductor area of the second conductive type disposed, in the semiconductor substrate, under the dummy gate electrode and alongside the second semiconductor area.

6. The semiconductor device according to claim 1, further comprising a fifth semiconductor area that is non-doped and disposed over the first semiconductor area.

7. The semiconductor device according to claim 1, further comprising a device isolation area disposed in the surface layer portion of the semiconductor substrate,
    wherein an edge of the dummy gate electrode in a second direction perpendicular to the first direction is located over the device isolation area.

8. The semiconductor device according to claim 1, wherein the dummy gate electrode includes two dummy gate electrodes, and
    the gate electrode is disposed between the two dummy gate electrodes.

9. The semiconductor device according to claim 8, wherein the gate electrode includes two or more gate electrodes, and
    the two or more gate electrodes are disposed between the two dummy gate electrodes.

10. The semiconductor device according to claim 1, wherein the portion of the lower concentration of carrier of the first carrier type in the semiconductor substrate under the dummy gate electrode is disposed in the surface layer portion of the semiconductor substrate.

11. A manufacturing method for manufacturing a semiconductor device, comprising:
    forming a first semiconductor area of a first conductive type disposed in a surface layer portion of a semiconductor substrate;
    forming a gate electrode disposed over the first semiconductor area, extending in a first direction, and being a conductive material;
    forming a dummy gate electrode disposed over the semiconductor substrate away from the gate electrode, extending in the first direction, and being the conductive material;
    forming a second semiconductor area of a second conductive type disposed, in the surface layer portion of the semiconductor substrate, between the gate electrode and the dummy gate electrode; and
    forming an interconnect connected to the second semiconductor area,
    wherein the forming of the gate electrode and the forming of the dummy gate electrode include exposing a photoresist and developing the photoresist by using a single exposure mask on which a pattern for the gate electrode and a pattern for the dummy gate electrode are formed, and wherein a concentration of carrier of a first carrier type in the semiconductor substrate under the dummy gate electrode and alongside the second semiconductor area is lower than a concentration of majority carrier in the first semiconductor area, the first carrier type is a same carrier type as the majority carrier, and a portion of the lower concentration of carrier of the first carrier type in the semiconductor substrate under the dummy gate electrode is disposed in contact with the second semiconductor area.

12. The manufacturing method for manufacturing the semiconductor device according to claim 11, wherein the dummy gate electrode is disposed alongside the gate electrode and extending at least an entirety of a portion of the gate electrode over the first semiconductor area.

13. The manufacturing method for manufacturing the semiconductor device according to claim 11, wherein a distance between the gate electrode and the dummy gate electrode is constant throughout an entirety of a portion of the gate electrode over the first semiconductor area.

14. The manufacturing method for manufacturing the semiconductor device according to claim 11, further comprising:

forming a third semiconductor area of the second conductive type disposed, in the semiconductor substrate, at a side opposite to the gate electrode with respect to the dummy gate electrode, wherein a potential of the third semiconductor area is floating.

15. The manufacturing method for manufacturing the semiconductor device according to claim 11, further comprising:

forming a fourth semiconductor area of the second conductive type disposed, in the semiconductor substrate, under the dummy gate electrode and alongside the second semiconductor area.

16. The manufacturing method for manufacturing the semiconductor device according to claim 11, further comprising:

forming a fifth semiconductor area that is non-doped and disposed over the first semiconductor area.

17. The manufacturing method for manufacturing the semiconductor device according to claim 11, further comprising:

forming a device isolation area disposed in the surface layer portion of the semiconductor substrate, wherein an edge of the dummy gate electrode in a second direction perpendicular to the first direction is located over the device isolation area.

18. The manufacturing method for manufacturing the semiconductor device according to claim 11, wherein the forming of the dummy gate electrode includes forming two dummy gate electrodes, and the forming of the gate electrode includes forming the gate electrode between the two dummy gate electrodes.

19. The manufacturing method for manufacturing the semiconductor device according to claim 18, wherein the forming of the gate electrode includes forming two gate electrodes between the two dummy gate electrodes.

20. The manufacturing method for manufacturing the semiconductor device according to claim 11, wherein the portion of the lower concentration of carrier of the first carrier type in the semiconductor substrate under the dummy gate electrode is disposed in the surface layer portion of the semiconductor substrate.

* * * * *